(12) United States Patent
Maeda

(10) Patent No.: US 10,541,378 B2
(45) Date of Patent: Jan. 21, 2020

(54) DISPLAY DEVICE

(71) Applicant: Japan Display Inc., Tokyo (JP)

(72) Inventor: Norihisa Maeda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/951,305

(22) Filed: Apr. 12, 2018

(65) Prior Publication Data

US 2018/0331315 A1 Nov. 15, 2018

(30) Foreign Application Priority Data

May 12, 2017 (JP) .................................. 2017-095269

(51) Int. Cl.
| | |
|---|---|
| *H01L 51/50* | (2006.01) |
| *H01L 51/52* | (2006.01) |
| *H01L 27/32* | (2006.01) |
| *H01L 51/00* | (2006.01) |

(52) U.S. Cl.
CPC ...... *H01L 51/5056* (2013.01); *H01L 27/3246* (2013.01); *H01L 27/3276* (2013.01); *H01L 51/0002* (2013.01); *H01L 51/5012* (2013.01); *H01L 51/5072* (2013.01); *H01L 51/5203* (2013.01); *H01L 27/3211* (2013.01)

(58) Field of Classification Search
CPC ............. H01L 27/3246; H01L 27/3276; H01L 51/5203; H01L 51/5056; H01L 51/5072

USPC ............................ 257/40, 88, 89; 438/34, 35
See application file for complete search history.

(56) References Cited

U.S. PATENT DOCUMENTS

| | | | |
|---|---|---|---|
| 2013/0140529 A1* | 6/2013 | Seong ................. | H01L 27/3246 257/40 |
| 2016/0118449 A1 | 4/2016 | Sato et al. | |
| 2018/0190738 A1* | 7/2018 | Park .................... | H01L 27/3211 |

FOREIGN PATENT DOCUMENTS

JP       2016-085913 A      5/2016

* cited by examiner

*Primary Examiner* — Mohammed Shamsuzzaman
*Assistant Examiner* — Aaron J Gray
(74) *Attorney, Agent, or Firm* — Michael Best & Friedrich LLP

(57) ABSTRACT

A display device includes a first electrode, a second electrode adjacent to the first electrode, a barrier wall between the first electrode and the second electrode; a wiring arranged above the barrier wall, and arranged between the first electrode and the second electrode, an organic layer covering the first electrode, the second electrode, the barrier wall and the wiring, and a third electrode covering the organic layer, wherein a width of the wiring is narrower than a length between the first electrode and the second electrode, and a resistance value between the wiring and the third electrode is higher than a resistance value between the first electrode and the third electrode.

5 Claims, 23 Drawing Sheets

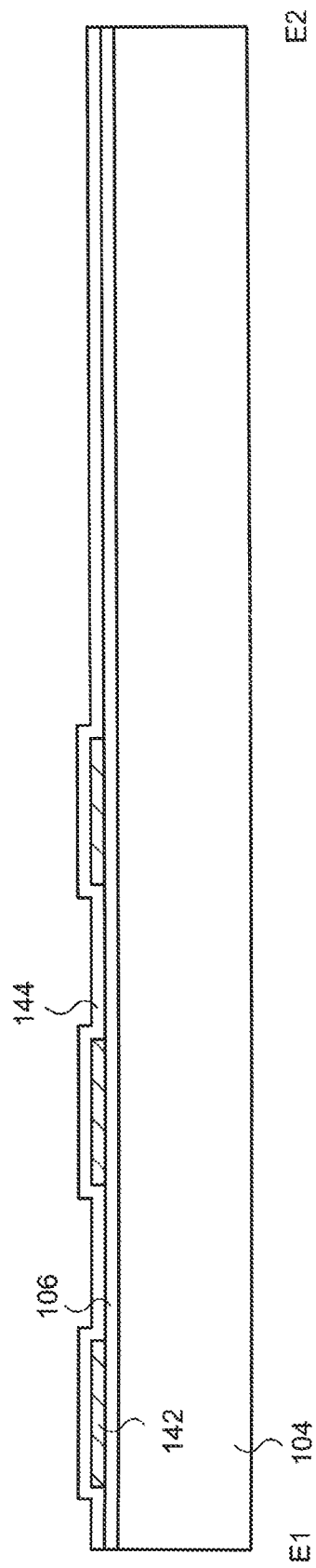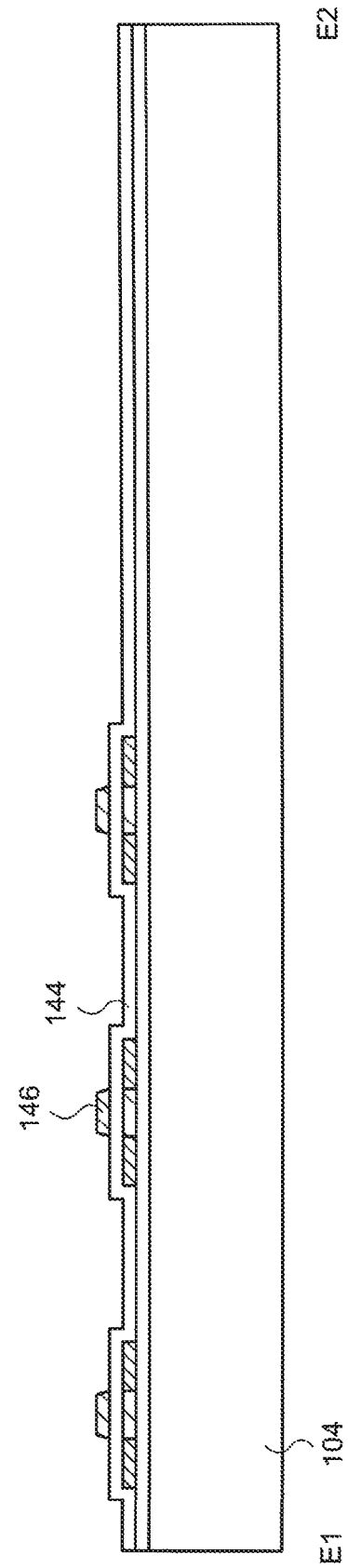

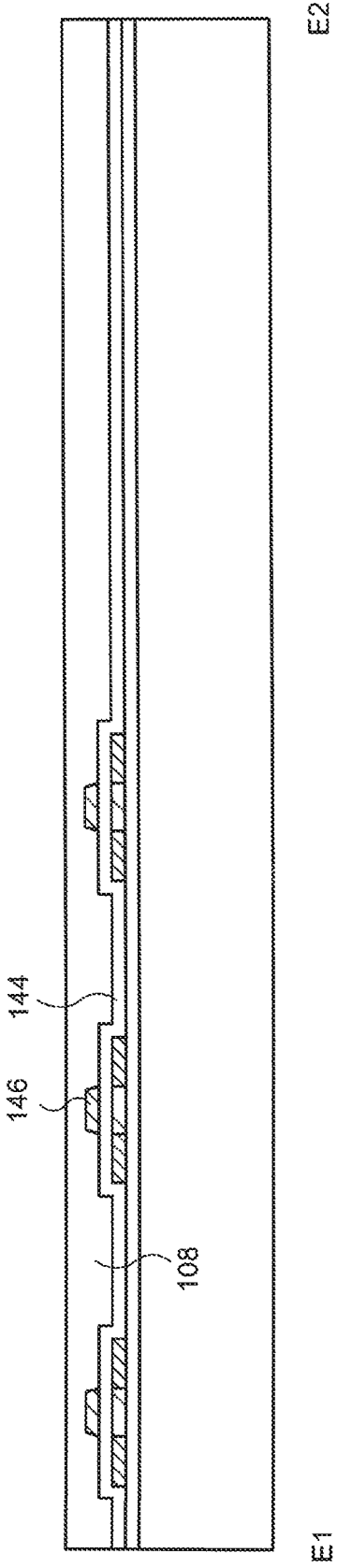
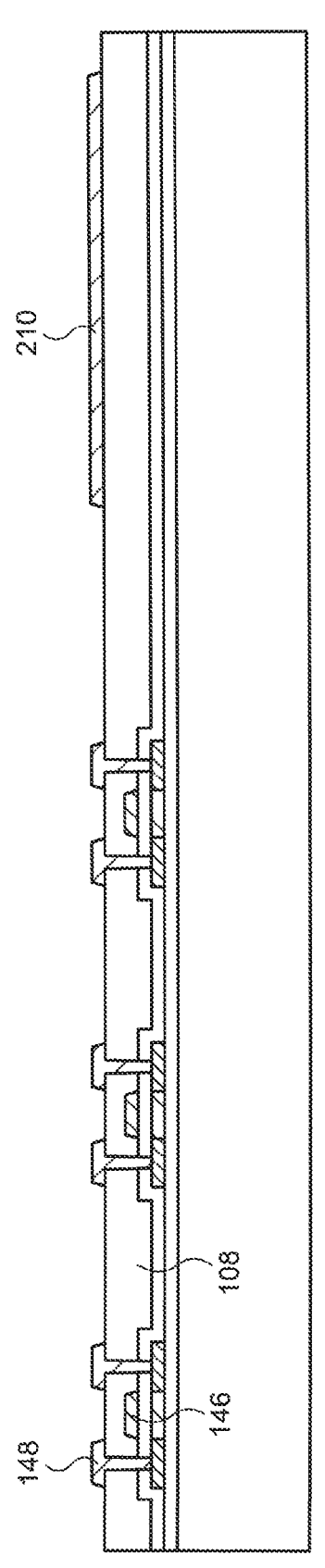

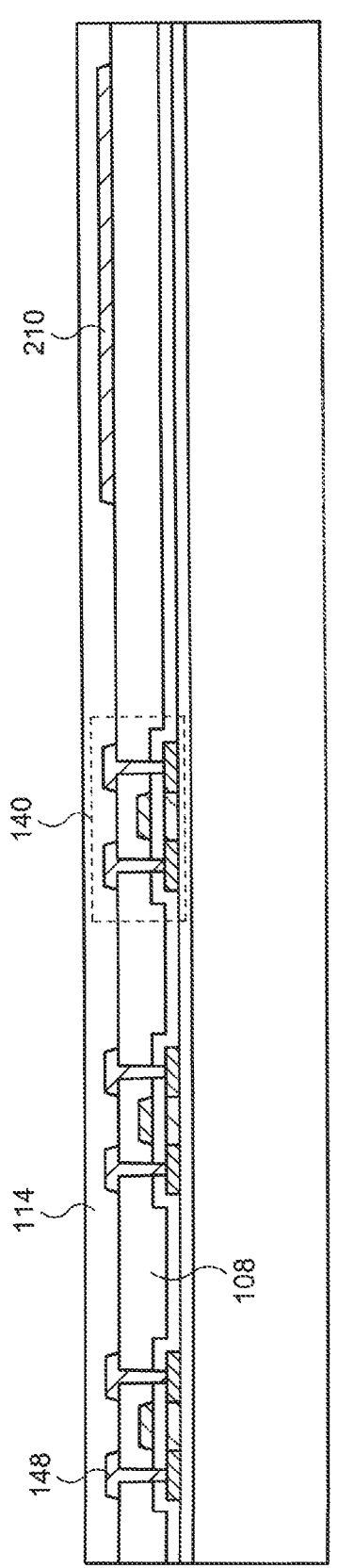
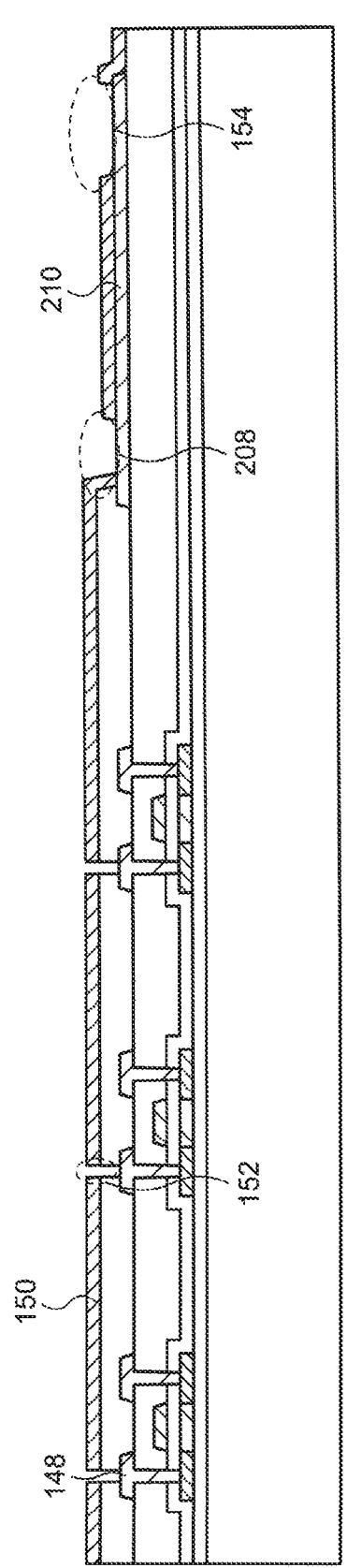
FIG. 21A
FIG. 21B

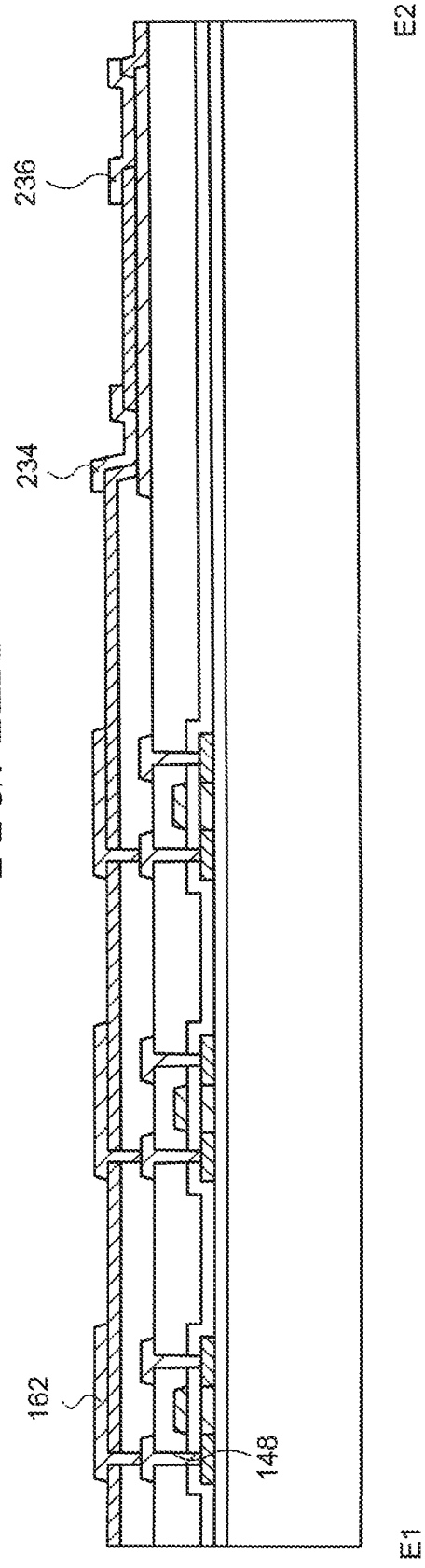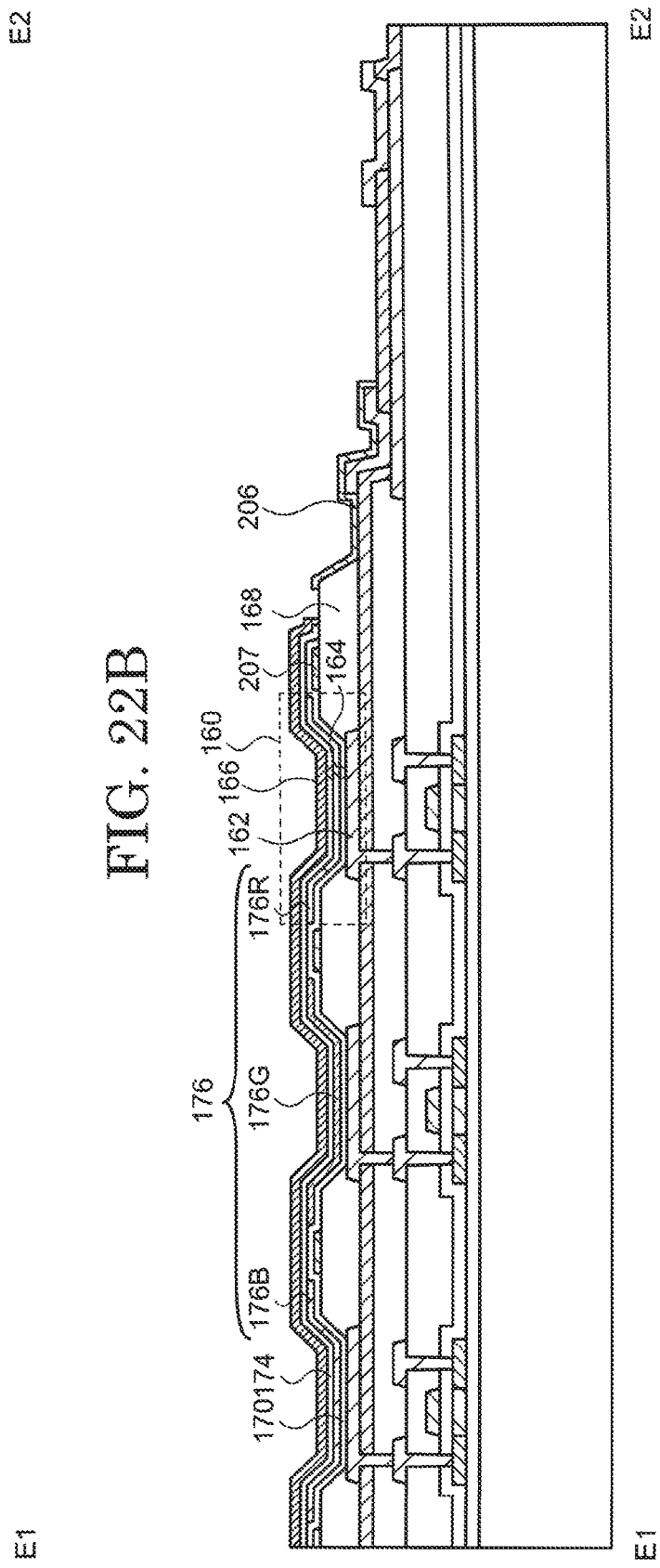

DISPLAY DEVICE

CROSS REFERENCE TO RELATED APPLICATIONS

This application is based upon and claims the benefit of priority from the prior Japanese Patent Application No. 2017-095269, filed on May 12, 2017, the entire contents of which are incorporated herein by reference.

FIELD

One embodiment of the present invention is related to a structure of a region arranged with a pixel in a display device.

BACKGROUND

An organic electroluminescence (EL) display device (referred to herein as an EL display device) has a plurality of pixels formed on a substrate. In addition, each of the plurality of pixels includes a plurality of transistors, a capacitor element, and an organic light emitting element (referred to herein as a light emitting element). The light emitting element is formed from, for example, an anode, a cathode and an EL layer. For example, carriers (electrons, holes) are injected into the EL layer from the anode and the cathode due to a potential difference applied to the anode and the cathode, and carrier recombination occurs in the EL layer. Then, the organic compound included in the EL layer is in an excited state. Furthermore, energy is released when this excited state relaxes to a ground state, whereby the light emitting element emits light. Each pixel is driven by a signal controlling a pixel. By controlling the driving of the transistor included in each pixel by this signal, the current supplied to the light emitting element is controlled. Then, the EL display device can display images. In recent years, there has been increasing demand for displaying images finely on display devices. That is, the demand for higher definition of EL display devices is increasing. When a display device becomes high definition, the amount of data of the image also increases and power consumption increases. Therefore, in an EL display device, there is also a high demand for low power consumption.

As the definition of the EL display device becomes higher, the distance between pixels becomes closer. Therefore, the influence of a leak current (also referred to herein as "lateral leak current") flowing between adjacent pixels becomes significant. In addition, in order to reduce the power consumption of an EL display device, it is possible to reduce the difference between the voltages applied between the anode and the cathode by using a material having a high conductivity for the EL layer. However, since a material with high conductivity has high mobility, the lateral leak current is also large. In the EL display device, the lateral leak current causes adjacent pixels to emit light, and there is a possibility of reducing color purity. For example, Japanese Laid Open Patent Publication No. 2016-85913 discloses an EL display device in which a lateral leak current is reduced.

SUMMARY

One embodiment of the present invention is a display device including a first electrode, a second electrode adjacent to the first electrode, a barrier wall between the first electrode and the second electrode; a wiring arranged above the barrier wall and arranged between the first electrode and the second electrode, an organic layer covering the first electrode, the second electrode, the barrier wall and the wiring, and a third electrode covering the organic layer, wherein a width of the wiring is narrower than a length between the first electrode and the second electrode, and a resistance value between the wiring and the third electrode is higher than a resistance value between the first electrode and the third electrode.

One embodiment of the present invention is a display device including a first electrode layer including a plurality of first electrodes arranged in a first direction and a second direction intersecting the first direction, a second electrode layer, a plurality of light emitting layers arranged in the first direction and a second direction intersecting the first direction, an organic layer, a wiring layer including a plurality of wirings extending in the first direction and the second direction, and a barrier wall, wherein the plurality of wirings is in contact with a top of the barrier wall, the organic layer is arranged between the wiring layer and the second electrode layer, the light emitting layer is arranged between the wiring and wiring adjacent to the wiring, each of the plurality of wrings are electrically connected to each other at two or more regions, and the two or more regions are mutually and electrically separated from each other.

BRIEF DESCRIPTION OF DRAWINGS

FIG. 19A is a schematic cross-sectional diagram for explaining a manufacturing method of a display device related to one embodiment of the present invention;

FIG. 19B is a schematic cross-sectional diagram for explaining a manufacturing method of a display device related to one embodiment of the present invention;

FIG. 20A is a schematic cross-sectional diagram for explaining a manufacturing method of a display device related to one embodiment of the present invention;

FIG. 20B is a schematic cross-sectional diagram for explaining a manufacturing method of a display device related to one embodiment of the present invention;

FIG. 21A is a schematic cross-sectional diagram for explaining a manufacturing method of a display device related to one embodiment of the present invention;

FIG. 21B is a schematic cross-sectional diagram for explaining a manufacturing method of a display device related to one embodiment of the present invention;

FIG. 22A is a schematic cross-sectional diagram for explaining a manufacturing method of a display device related to one embodiment of the present invention;

FIG. 22B is a schematic cross-sectional diagram for explaining a manufacturing method of a display device related to one embodiment of the present invention.

DESCRIPTION OF EMBODIMENTS

Figure 1:
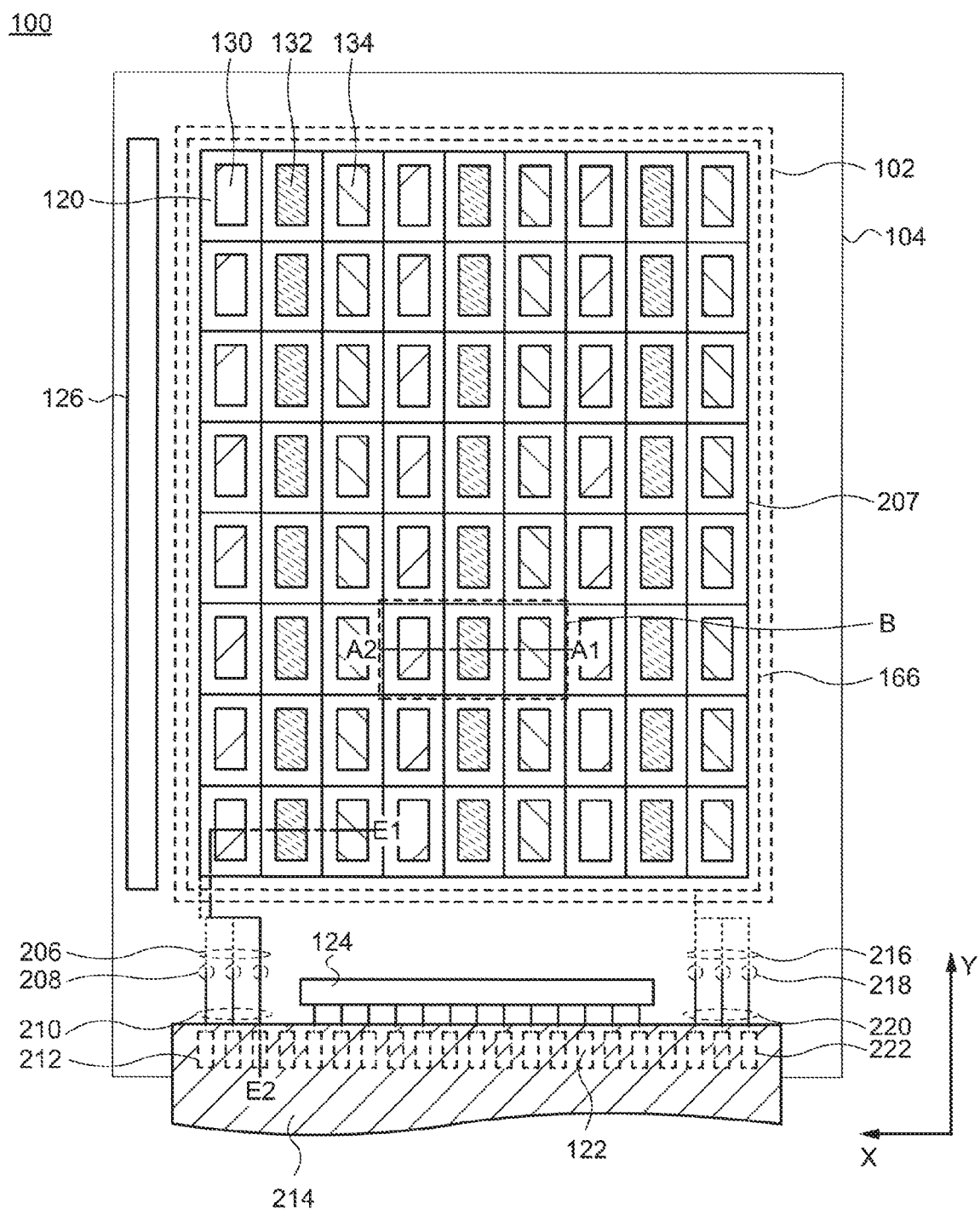
FIG. 1 is a schematic planar view diagram of a display device related to one embodiment of the present invention.

Embodiments of the present invention are explained below while referring to the drawings and the like. However, the present invention can be performed in many different modes and is not to be interpreted as being limited to the description of the embodiments exemplified below. In addition, in order to make the explanation clearer, the drawings may be schematically represented in terms of the width, thickness and shape and the like of each part compared with their actual forms, and are only an example, and therefore an interpretation of the present invention is not limited. Furthermore, in this specification and each drawing, elements similar to those described previously with reference to the previous drawings are denoted by the same reference numerals (or reference numerals with a, b, etc. followed by a numeral) and a detailed explanation may be omitted as appropriate. Furthermore, letters added with "first" and "second" to each element are convenience symbols used to distinguish each element and do not have any other meaning unless otherwise specified.

In the present specification, when a certain member or region is referred to as "above (or below)" another member or region, unless there is any special limitation, this includes not only being directly above (or directly below) another member or region but also above (or below) another member or area, that is, the case where another component is included between the upper (or lower) the other member or area. In the following explanation, unless otherwise specified, the side on which each layer of an insulating layer, a semiconductor layer and a conductive layer, or each element such as a transistor and a light emitting element are arranged with respect to the substrate is referred to as "upper" or "above", and the opposite side is referred to as "lower" or "below".

The first substrate explained in the present specification has at least a planar shaped main surface, and each layer of the insulating layer, the semiconductor layer and the conductive layer, or each element such as the transistor and the light emitting element are arranged on this one main surface. In the following explanation, in the case where an explanation is made on the basis of "upper", "upper layer", "below" or "upper surface" with respect to the first substrate with one main surface of the substrate as a reference in a cross-sectional view, unless otherwise specified, it is explained with reference to the one main surface of the substrate.

The EL display device described in Japanese Laid Open Patent Publication No. 2016-85913 requires a bias circuit in order to suppress lateral leakage. When an image is displayed by the EL display device, since it is necessary to operate the bias circuit, there is concern that the power consumption of the EL display device increases.

In view of such a problem, one embodiment of the present invention is to provide a display device which suppresses a lateral leak current. Another object of one embodiment of the present invention is to provide a display device with low power consumption.

<First Embodiment>

The structure of a display device according to one embodiment of the present invention is explained.

FIG. 1 is a schematic planar diagram of a display device (referred to as a display device herein) 100 according to one embodiment of the present invention.

Figure 2:
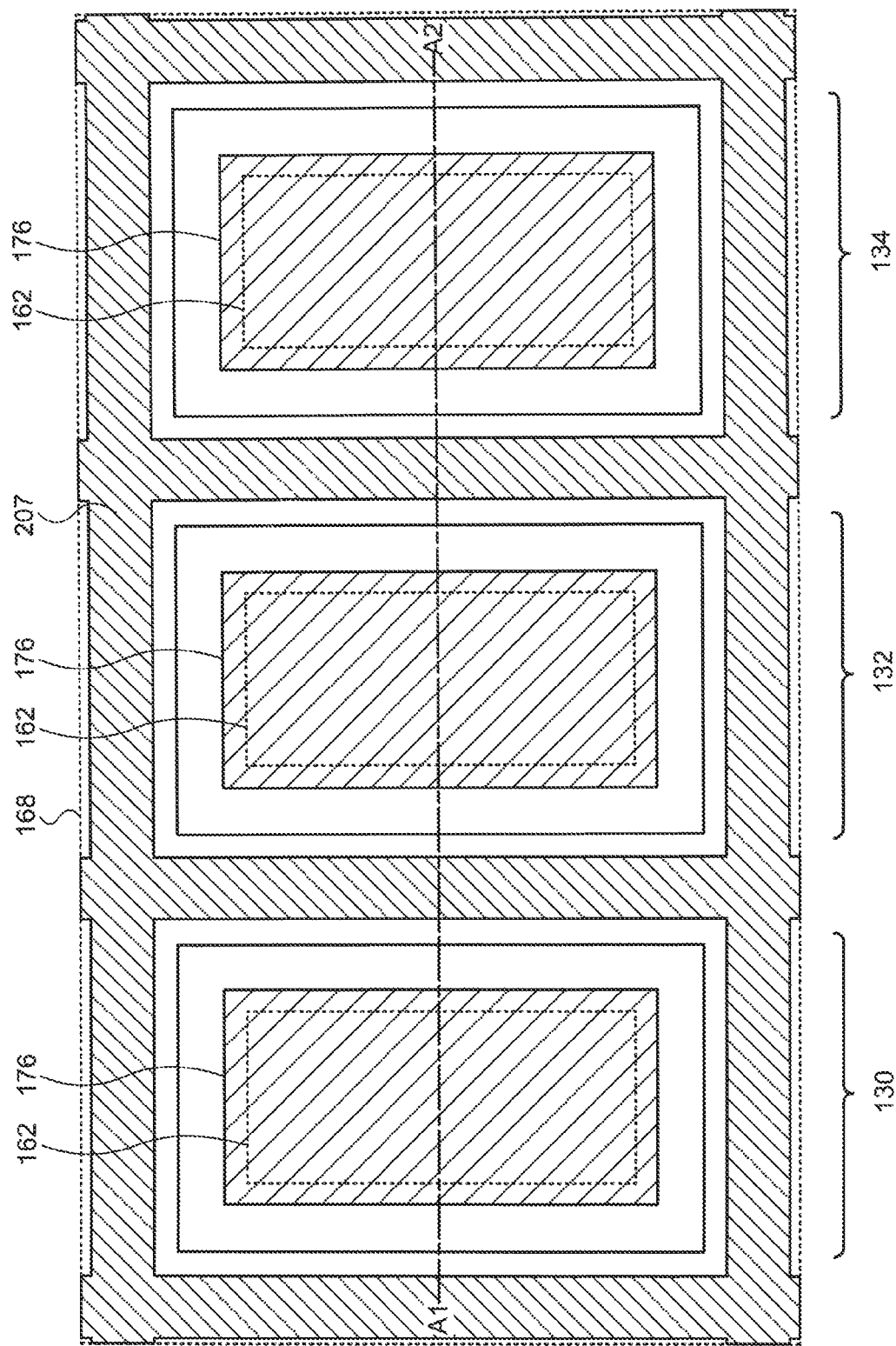
FIG. 2 is a schematic planar view diagram showing a pixel and wiring of a display device related to one embodiment of the present invention.

FIG. 2 is a schematic planar diagram of a pixel and wiring included in the display device 100. In addition, FIG. 2 is an enlarged view of the region B in FIG. 1.

Figure 3:
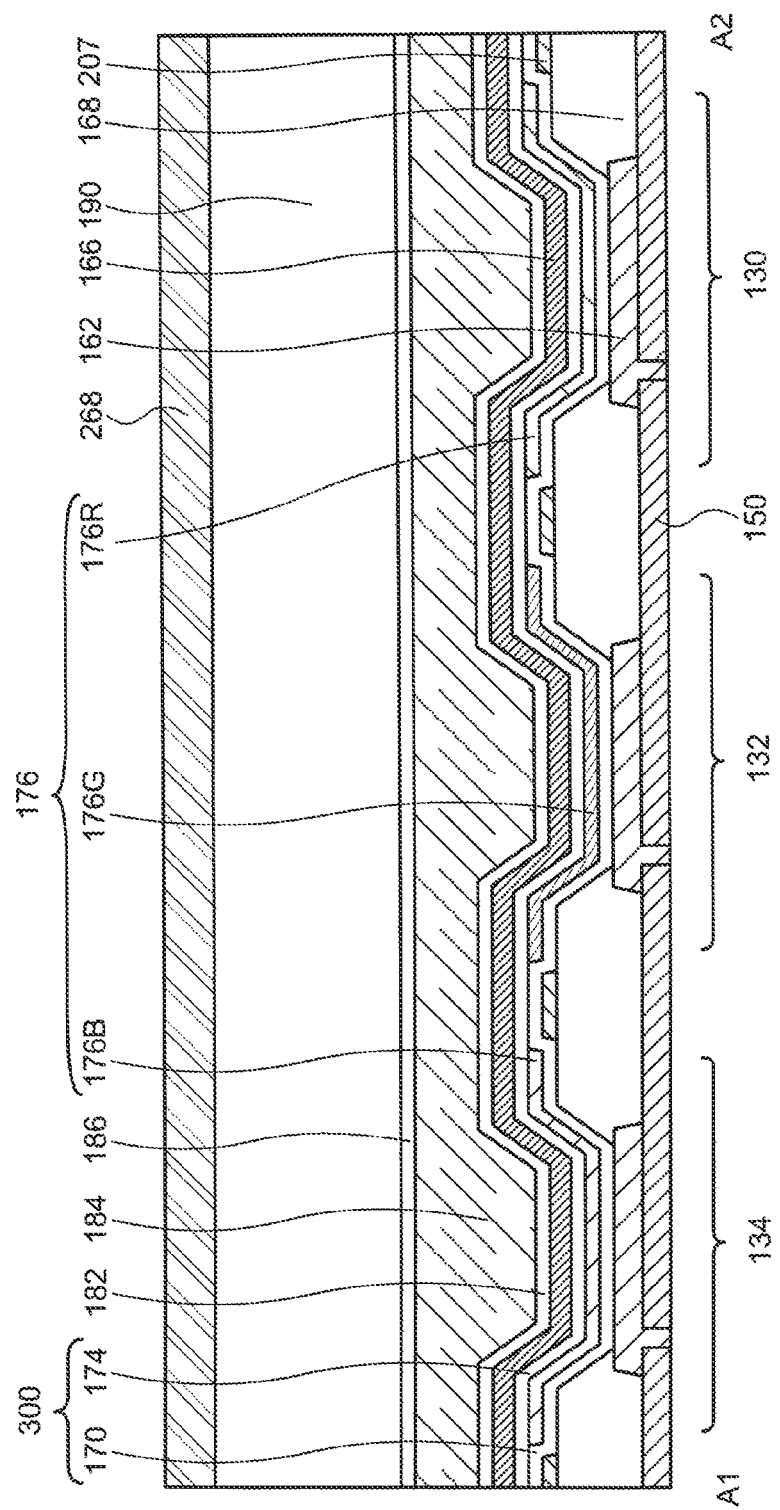
FIG. 3 is a schematic cross-sectional diagram showing the structure of a pixel included in a display device related to one embodiment of the present invention.
Figure 4:
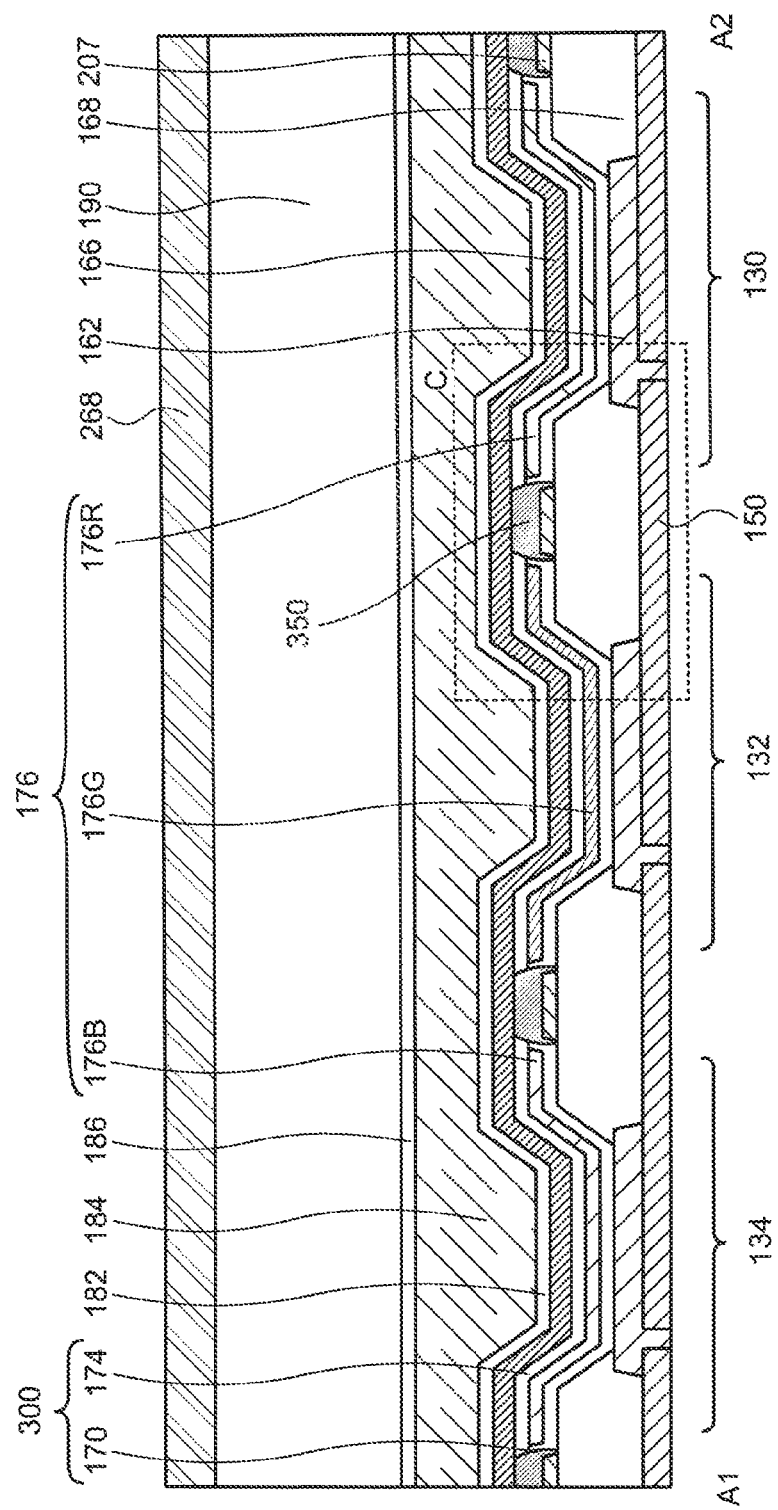
FIG. 4 is a schematic cross-sectional diagram showing the structure of a pixel included in a display device related to one embodiment of the present invention.

FIG. 3 and FIG. 4 are schematic cross-sectional diagrams showing a structure of a pixel included in the display device 100 and are schematic cross-sectional views along the lines A1 and A2 shown in FIG. 1 and FIG. 2.

The display device 100 includes a first electrode 162 and a first electrode adjacent to the first electrode 162. In addition, the display device 100 includes a partition wall 168 arranged between the first electrode 162 and the adjacent first electrode. Furthermore, the display device 100 includes wiring 207 arranged on the partition wall 168, and a first electrode 162. Furthermore, the display device 100 includes a first electrode adjacent to the first electrode 162, and an organic layer 300 covering the partition wall 168 and the wiring 207. Here, the organic layer 300 is arranged between the wiring 207 and the second electrode layer 166. The width of the wiring 207 is narrower than the length between the first electrode 162 and the first electrode adjacent to the first electrode 162. In addition, by applying a voltage to each of the wiring 207 and the second electrode layer 166 and providing a potential difference, it is possible to increase a resistance value between the wiring 207 and the second electrode layer 166. Furthermore, the organic layer 300 has at least one continuously spread layer between adjacent pixel electrodes. In addition, at least one continuously spread layer has conductivity for transporting carriers such as holes and electrons. For example, the organic layer 300 may be formed from at least one of an electron transport layer 174 and a hole transport layer 170. In addition, a light emitting layer 176 is included between the first electrode 162 and the second electrode layer 166. When a voltage is applied to each of the first electrode 162 and the second electrode layer 166 to provide a potential difference, electrons are injected from the electron transporting layer 174 into the light emitting layer 176. When a voltage is applied to each of the first electrode 162 and the second electrode layer 166 to provide a potential difference, holes are injected from the hole transporting layer 170 into the light emitting layer 176. Therefore, since a current flows between the first electrode 162 and the second electrode layer 166, it is possible to reduce the resistance value between the first electrode 162 and the second electrode layer 166. Therefore, the resistance value between the wiring 207 and the second electrode layer 166 is higher than the resistance value between the first electrode 162 and the second electrode layer 166. Furthermore, it is preferred that a potential difference (V1) of a voltage applied to each of the wiring 207 and the second electrode layer 166 is higher than a potential difference (V2) of a voltage applied to each of the first electrode 162 and the second electrode layer 166. Here, the first electrode 162 is a pixel electrode. In addition, the first electrode adjacent to the first electrode 162 is also a pixel electrode.

The display device 100 includes a first electrode layer having a plurality of first electrodes 162, a second electrode layer 166, a plurality of light emitting layers 176 arranged in a first direction and a second direction intersecting the first direction, an organic layer 300, a wiring layer having a plurality of wirings 207 extending in a first direction and a second direction intersecting the first direction, and a partition wall 168. In addition, in the display device 100, the wiring 207 is arranged to be in contact with the partition wall 168. An organic layer 300 is arranged between the wiring 207 and the second electrode layer 166. The plurality of wirings 207 are electrically connected.

In addition, it can be said that increasing the resistance value between the wiring 207 and the second electrode layer 166 means increasing the insulating properties of the organic layer 300 including the electron transporting layer 174 and the hole transporting layer 170 arranged between the wiring 207 and the second electrode layer 166. In one embodiment of the present invention, it may also be said that increasing the resistance value is deteriorating. In addition, in one embodiment of the present invention, it may also be said that increasing insulation properties means deteriorating. For example, when it is desired to flow the same current as before the organic layer 300 deteriorates to the organic layer 300 after the organic layer 300 has deteriorated, the voltage applied to the organic layer 300 after degradation must be higher than the voltage applied to the organic layer 300 before degradation. In other words, it can be said that deterioration of the organic layer 300 means it has a large resistance value.

By providing the display device 100 according to one embodiment of the present invention with the structure described above, it is possible to increase the resistance value between the wiring 207 and the second electrode layer 166. Therefore, in the display device 100 according to one embodiment of the present invention, even if one subpixel is made to emit light, it is possible to prevent a hole excited from the hole transport layer 170 in this subpixel reaching an end part of a subpixel adjacent to this subpixel. That is, the display device 100 according to one embodiment of the present invention is a display device which can suppress lateral leakage current. In addition, in the display device 100 according to one embodiment of the present invention, it is possible to prevent pixels other than pixels which should emit light from unexpectedly emitting light. Therefore, by using the display device according to one embodiment of the present invention, it is possible to prevent color mixing. Therefore, by adopting the structure described above, it is possible to provide a display device which can display a clear image without reducing the color purity of the display device.

As is shown in FIG. 1, the display device 100 includes a substrate 104, a display region 102, wiring 207, a second electrode layer 166 and a pixel 120. The display region 102, the wiring 207, the second electrode layer 166 and the pixel 120 are arranged over the substrate 104. A plurality of pixels 120 are arranged in the display region 102. The pixel 120 has a subpixel 130, a subpixel 132 and a subpixel 134. A scanning line driving circuit 126 and an IC chip 124 for controlling driving of the pixel 120 are arranged outside the display region 102. Here, although an example is shown in which the scanning line driving circuit 126 and the IC chip 124 are arranged on the substrate 104, the present invention is not limited to this example. For example, a driving circuit formed on a substrate (a semiconductor substrate or the like) different from the substrate 104 may also be arranged on a connector 214 such as the substrate 104 or a flexible printed circuit (FPC) substrate. A part or the whole of the circuit included in the scanning line driving circuit 126 and the IC chip 124 may be formed on a substrate different from the substrate 104 and the substrate different from the substrate 104 may be arranged on the substrate 104 or the connector 214. In addition, the driving circuit included in the IC chip 124 or a part of the drive circuit may be formed directly on the substrate 104. Furthermore, although not shown here, display elements such as light emitting elements arranged in the pixels 120 and various semiconductor elements for controlling them are formed on the substrate 104. In order to promote understanding, the wiring 207 is shown by a solid line in FIG. 1, and the wiring 207 has a finite width as shown in FIG. 2.

In addition, the display device 100 includes first wiring 206, a contact hole 208, first terminal wiring 210, a first terminal 212, second wiring 216, a contact hole 218, second terminal wiring 220, a second terminal 222 and a third terminal 122. These are also arranged on the substrate 104 similar to the scanning line driving circuit 126.

In addition, in the display device 100, the wiring 207 extends in a first direction and a second direction intersecting the first direction and is electrically connected. In addition, the wiring 207 is arranged between a light emitting layer 176 included in a subpixel and a light emitting layer 176 of an adjacent subpixel. Furthermore, the wiring 207 is electrically connected to the first wiring 206 which extends from outside of the display region 102. The first wiring 206 extends outside the display region 102 and is electrically connected to the first terminal wiring 210 via the contact hole 208. The first terminal wiring 210 is exposed in the vicinity of the end part of the display device 100 and forms the first terminal 212. The first terminal 212 is connected to the connector 214. A voltage applied to the wiring 207 is provided to the wiring 207 from an external circuit (not shown in the drawing) via the first terminal 212.

Similarly, the second electrode layer 166 is electrically connected to the second wiring 216 extending from outside of the display region 102. The second wiring 216 extends through the outside the display region 102 and is electrically connected to the second terminal wiring 220 via the contact hole 218. The second terminal wiring 220 is exposed near the vicinity of the display device 100 and forms the second terminal 222. The second terminal 222 is connected to the connector 214. The voltage applied to the second electrode layer 166 is provided to the second electrode layer 166 from an external circuit via the second terminal 222.

Furthermore, supply of a signal to the pixels 120 in the display region 102 is performed from an external circuit (not shown in the drawing) via the third terminal 122, the scanning line driving circuit 126 and the IC chip 124. The first terminal 212, the second terminal 222 and the third terminal 122 can be formed to be aligned along one side of the display device 100. As a result, it is possible to supply a voltage and signals to the display region 102, the wiring 207 and the second electrode layer 166 using one single connector 214.

Furthermore, in FIG. 1, an example of the pixel 120 having a stripe arrangement is shown. In FIG. 1, an example is shown in which one pixel 120 is formed by three subpixels, namely a subpixel 130, subpixel 132 and a subpixel 134. Each subpixel is arranged with one display element such as a light emitting element. The color corresponding to a subpixel is determined by the characteristics of a light emitting element or a color filter arranged on a subpixel. In the present specification and the claims, the pixel 120 refers to a pixel having one light emitting element and a plurality of subpixels providing at least one different color. The pixel 120 is the smallest unit which forms a part of an image reproduced in the display region 102. A subpixel included in the display region 102 is included in one of the pixels 120.

In addition, in a stripe arrangement, three subpixels 130, subpixel 132 and subpixel 134 are formed to emit different colors. For example, each of the subpixel 130, the subpixel 132 and the subpixel 134 may be arranged with a light emitting layer that emits light of three primary colors of red, green, and blue. Next, a full color display device can be provided by supplying 256 levels of a voltage or current to each of the three subpixels. In the case when the light emitting layers emit different colors, the wirings 207 arranged between the light emitting layers are electrically connected to each other. Furthermore, in the case when the light emitting layers of adjacent subpixels emit the same color, the wiring 207 arranged between the light emitting layers may not be electrically connected. By electrically connecting the wirings 207 to each other, it is possible to uniformly apply a voltage to each of the second electrode layer 166 and the wiring 207 and thereby provide a potential difference. Therefore, it is possible to uniformly increase the resistance of the electron transport layer 174 and the hole transport layer 170 arranged between the wiring 207 and the second electrode layer 166.

FIG. 2 is an enlarged view of the region B shown in FIG. 1. Furthermore, the second electrode layer 166, the electron transport layer 174, and the hole transport layer 170 are arranged over the entire surface.

As is shown in FIG. 3, in the subpixel 130, the first electrode 162 and the partition wall 168 are arranged on the inorganic insulating film 150. In addition, a hole transport layer 170, a light emitting layer 176, an electron transport layer 174, a second electrode layer 166, a layer (first inorganic film) 182, a layer (second inorganic film) 186, a layer (organic film) 184, an organic insulating film 190 and a cover film 268 are arranged on the first electrode 162. The light emitting layer 176 is formed from a light emitting layer 176R, a light emitting layer 176G and a light emitting layer 176B. The hole transporting layer 170, the electron transporting layer 174 and the second electrode layer 166 arranged over the wiring 207 are continuously spread to each other. Furthermore, a wiring 207 is arranged on the partition wall 168. In addition, the partition wall 168 and the wiring 207 are in contact with each other. The subpixel 132 and the subpixel 134 are also similar to the subpixel 130. Furthermore, FIG. 3 shows an example in which the cover film 268 is arranged on the organic insulating film 190. However, the cover film 268 is not necessary. Furthermore, FIG. 3 shows a cross section of the structure above the inorganic insulating film 150 and the first electrode 162 in order to promote understanding.

In addition, each of the light emitting layer 176R, the light emitting layer 176G and the light emitting layer 176B is arranged between the wiring 207 and adjacent wiring 207. Furthermore, as described above, the wiring 207 extends in a first direction and a second direction intersecting the first direction and is electrically connected. By arranging the light emitting layer 176R, the light emitting layer 176G, the light emitting layer 176B, and the wiring 207 independently from each other, even when a voltage is applied to each of the wiring 207 and the second electrode layer 166 to provide a potential difference, there is no short circuit between each of the light emitting layer 176R, the light emitting layer 176G, the light emitting layer 176B and the wiring 207. In addition, since the light emitting layer 176R, the light emitting layer 176G, the light emitting layer 176B and the wiring 207 are arranged independently of each other, it is possible to increase the resistance of the electron transporting layer 174 and the hole transport layer 170.

In addition, it can be understood that the width of a part where the wiring 207 contacts the partition wall 168 is narrower than the width of the partition wall 168 which contacts the wiring 207. In other words, the width of the bottom part of the wiring 207 is narrower than the width of the upper part of the partition wall 168. In this way, it is possible to arrange the wiring 207 to reliably contact the partition wall 168. In addition, since the wiring 207 is arranged on the partition wall 168, the distance between the wiring 207 and the second electrode layer 166 can be reduced. The structure in which the distance between the wiring 207 and the second electrode layer 166 is short is a structure in which the electron transporting layer 174 and the hole transporting layer 170 are easily formed having a high resistance.

FIG. 4 schematically shows a state in which the electron transport layer 174 and the hole transport layer 170 are in a high resistance state after applying a potential difference between the wiring 207 and the second electrode layer 166 in FIG. 3. For example, in FIG. 4, a region in a high resistance state is shown by the high resistance region 350. The high resistance region 350 is a region in which a part of the continuously spread layer between adjacent first electrodes 162 (pixel electrodes) has high resistance (deteriorated). The high resistance state can also be said to be a deteriorated state. Furthermore, FIG. 4 also shows a cross section of the structure above the inorganic insulating film 150 and the first electrode 162 in order to promote understanding. In addition, in the high resistance region 350, the entire high resistance region 350 may be in a high resistance state, or the resistance may gradually increase from the outline part to the center part of the high resistance region 350.

In addition, the wiring 207 is independently arranged between the light emitting layer 176R of the subpixel 130 and the light emitting layer 176G of an adjacent subpixel 132. In FIG. 3 an example is shown in which the wiring 207 includes a gap between the light emitting layer 176R and the light emitting layer 176G respectively. In addition, at least one of the electron transporting layer 174 and the hole transporting layer 170 is arranged in this gap. The width of the bottom part of the wiring 207 is narrower than the width of the upper part of the partition wall 168. Furthermore, the width of the upper part of the partition wall 168 is larger than the distance between the wiring 207 and an adjacent light emitting layer 176G of the subpixel 132. In this way, when a voltage is applied to the second electrode layer 166 and the wiring 207, it is possible to reliably separate the second electrode layer 166, the light emitting layer 176R adjacent to the wiring 207, and the light emitting layer 176B by providing the high resistance region 350 between them. That is the high resistance region 350 is formed between the second electrode layer 166 and the wiring 207, and it is possible to suppress a lateral leakage current between adjacent subpixels. Furthermore, the end parts of the light emitting layer 176R, the light emitting layer 176G and the light emitting layer 176B may be covered by the wiring 207. When a potential difference is provided by applying a voltage to each of the wiring 207 and the second electrode layer 166 by covering the respective ends of the light emitting layer 176R, the light emitting layer 176G and the light emitting layer 176B with the wiring 207, the end parts of the light emitting layer 176R, the light emitting layer 176G and the light emitting layer 176B which are covered by the wiring 207 also become a part of the high resistance region 350. Therefore, it is possible to suppress a lateral leakage current between adjacent subpixels. In addition, it is possible to prevent adjacent pixels from emitting light.

In addition, the subpixel 130 includes a light emitting layer 176R corresponding to red and a first electrode 162. The subpixel 132 includes a light emitting layer 176G corresponding to green and a first electrode 162. The subpixel 134 includes a light emitting layer 176B corresponding to blue and a first electrode 162. First electrodes 162 adjacent to each other are separated by a partition wall 168. Furthermore, the first electrodes 162 adjacent to each other and the wiring 207 are separated by the partition wall 168. In this way, there is no short circuit between pairs of first electrodes 162 and the wiring 207, and it is possible to suppress a lateral leakage current between adjacent subpixels.

Furthermore, applying a voltage to each of the wiring 207 and the second electrode layer 166 may be performed at any stage as long as it is performed after arranging the wiring 207 and the second electrode layer 166. For example, it may be immediately after the manufacture of the display device 100 is completed, or just before the display device 100 is shipped. In addition, the voltage applied to the wiring 207 is preferred to be high compared to the voltage applied to the second electrode layer 166.

Figure 5:
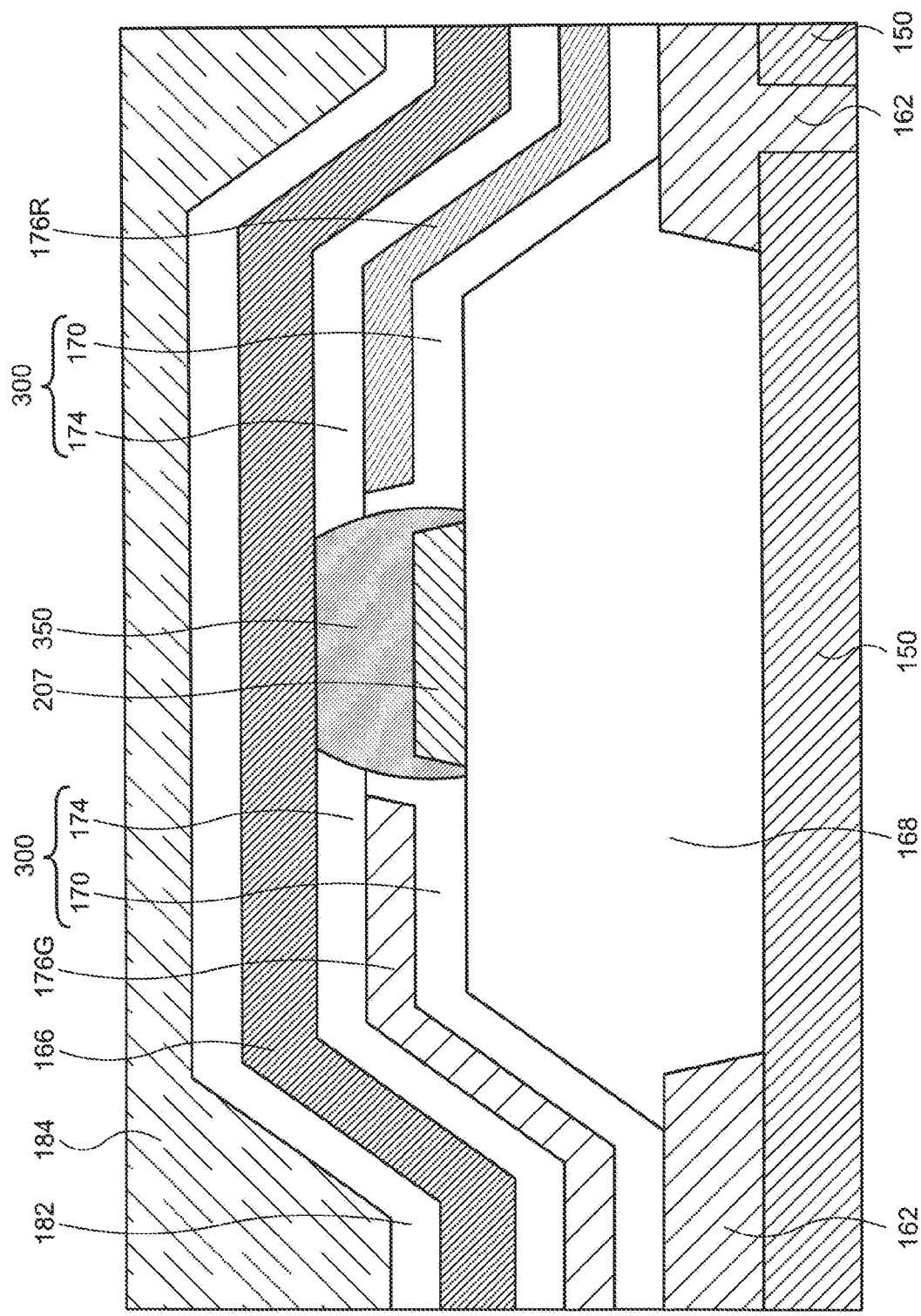
FIG. 5 is a schematic cross-sectional diagram showing the structure of a pixel included in a display device related to one embodiment of the present invention.

FIG. 5 is an enlarged view of the region C shown in FIG. 4. The high resistance region 350 may be present not only on the upper surface of the wiring 207 but also on the side surface or side wall of the wiring 207 and a region in contact with the partition wall 168. As an example, the electron transport layer 174 arranged between the wiring 207 and the second electrode layer 166, the hole transport layer 170, the upper surface of the wiring 207, and a surface of the second electrode layer 166 arranged above the wiring 207 are ideal planes and in the case where each is parallel to each other, the high resistance region 350 becomes a region between the upper surface of the wiring 207 and the second electrode layer 166 arranged above the wiring 207. In addition, it is possible to illustrate the case where the resistance value of the high resistance region 350 is given as R, the area of a part where the upper surface of the wiring 207 and the surface of the second electrode layer 166 arranged above the wiring 207 overlap is S, the thickness of the electron transport layer 174 is H1, the resistance ratio of the electron transport layer 174 is r1, the thickness of the hole transport layer 170 is H2, and the resistance ratio of the hole transport layer 170 is r2 in the formula (1)

$$R = r1 \times \frac{H1}{S} + r2 \times \frac{H2}{S} \tag{1}$$

Although an example is shown in one embodiment of the present invention in which the organic layer 300 between the wiring 207 and the second electrode layer 166 is formed from the electron transporting layer 174 and the hole transporting layer 170, the present invention is not limited to this example. The organic layer 300 may also be formed from a plurality of layers such as a hole injection layer, a hole transport layer, an electron injection layer and an electron transport layer. In the case where the organic layer 300 is formed from a plurality of layers, the resistance value Rn of the high resistance region 350 is expressed by the following formula (2) where the number of layers is n, the thickness of each layer is Hn and the resistance ratio of each layer is rn.

$$Rn = \sum_{i=1}^{n} rn \times \frac{Hn}{S} \tag{2}$$

Figure 6:
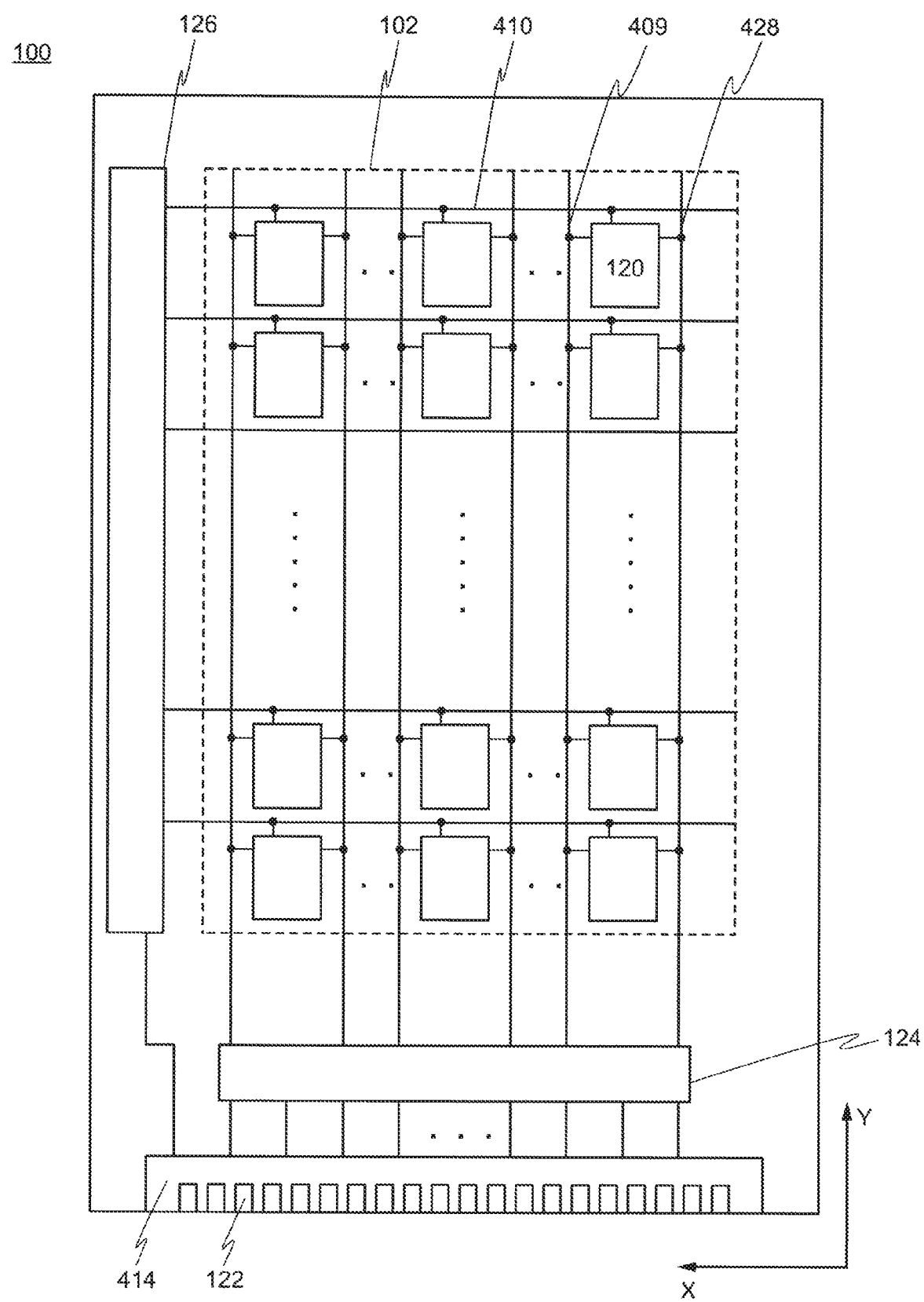
FIG. 6 is a schematic planar view diagram showing a circuit structure of a display device related to one embodiment of the present invention.

FIG. 6 is a schematic planar diagram of a circuit structure of a display device 100 according to one embodiment of the present invention. The display device 100 includes at least a display region 102, an image signal line 409, a scanning signal line 410, a drive power supply line 428, a scanning line driving circuit 126, an IC chip 124 and a terminal region 414. Furthermore, the display region 102 includes a plurality of pixels 120.

The scanning line driving circuit 126 and the IC chip 124 drive the pixel circuits 430 arranged in each of the plurality of pixels 120 to control the light emitted by the plurality of pixels 120.

The scanning line driving circuit 126 is connected to a plurality of scanning signal lines 410. The plurality of scanning signal lines 410 are arranged for each line (row) in a horizontal direction of the plurality of pixels 120. The scanning line driving circuit 126 sequentially selects a plurality of scanning signal lines 410 according to a timing signal and a power supply input from a plurality of third terminals 122.

The IC chip 124 is connected to a plurality of image signal lines 409. The plurality of image signal lines 409 are arranged for each line (column) in a vertical direction of the plurality of pixels 120. The IC chip 124 is input with an image signal from a plurality of third terminals 122. In addition, together with the selection of a scanning signal line 410 by the scanning line driving circuit 126, a voltage corresponding to an image signal of a selected pixel is written to each pixel 120 via each of the plurality of image signal lines 409. In addition, the IC chip 124 supplies a current supplied from the plurality of third terminals 122 to each drive power supply line 428. In this way, pixels 120 in a selected row emit light.

The plurality of pixels 120 are arranged in a row direction and a column direction. The number of pixels 120 which is arranged is arbitrary. For example, m pixels 120 are arranged in the row direction (X direction) and n pixels 120 are arranged in the column direction (Y direction) (m and n are integers). In the display area 102, the plurality of scanning signal lines 410 are arranged in the row direction, and the plurality of image signal lines 409 are arranged in the column direction.

Figure 7:
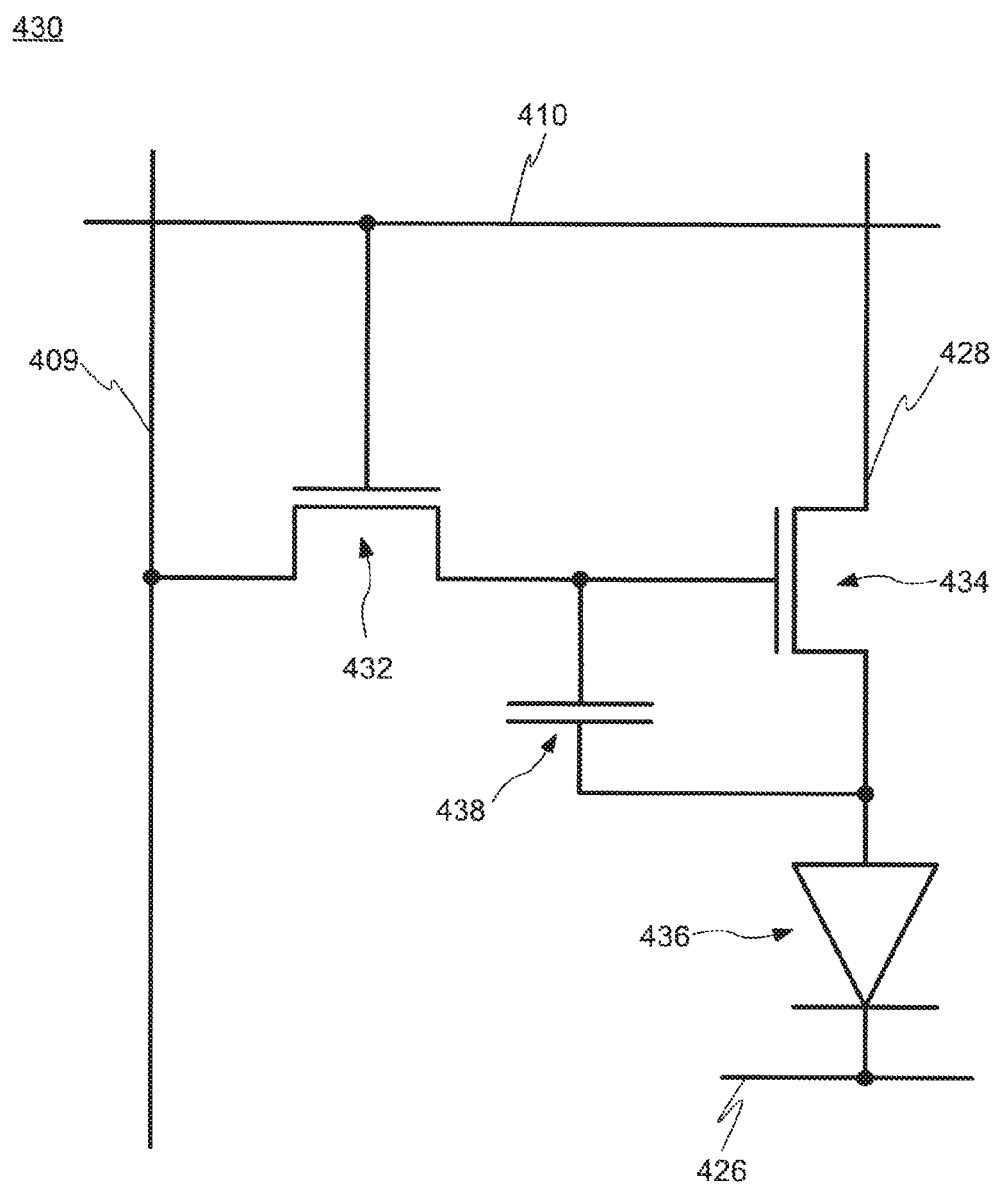
FIG. 7 is a schematic planar view diagram showing a pixel structure of a display device related to one embodiment of the present invention.

FIG. 7 shows a circuit diagram of a pixel circuit 430 of a pixel 120 included in a display device according to one embodiment of the present invention. Furthermore, the circuit structure of the pixel circuit 430 explained herein is an example. The circuit structure of the pixel circuit 430 is not limited to the structure explained herein.

Each of the plurality of pixel circuits 430 includes at least a drive transistor 434, a selection transistor 432, a light emitting element 436 and a storage capacitor 438.

The drive transistor 434 is a transistor which is connected to the light emitting element 436 and controls luminance of the light emitted by the light emitting element 436. In the drive transistor 434, the drain current is controlled by a gate/source voltage. The gate of the drive transistor 434 is connected to the drain of the selection transistor 432, the source is connected to a drive power supply line 428, and the drain is connected to the anode of the light emitting element 436.

The selection transistor 432 is a transistor that controls the conduction state between an image signal line 409 and the gate of the drive transistor 434 by an on and off operation. The gate of the selection transistor 432 is connected to a scanning signal line 410, the source is connected to an image signal line 409, and the drain is connected to the gate of the drive transistor 434.

The light emitting element 436 includes an anode connected to the drain of the drive transistor 434 and a cathode connected to a reference power supply line 426.

The storage capacitor 438 is connected between the gate and drain of the drive transistor 434. The storage capacitor 438 holds a gate/drain voltage of the drive transistor 434.

Here, as is described in FIG. 7, the reference power supply line 426 is arranged in common to a plurality of pixels 120. A constant potential is applied to the reference power line from a plurality of third terminals 122.

Figure 8:
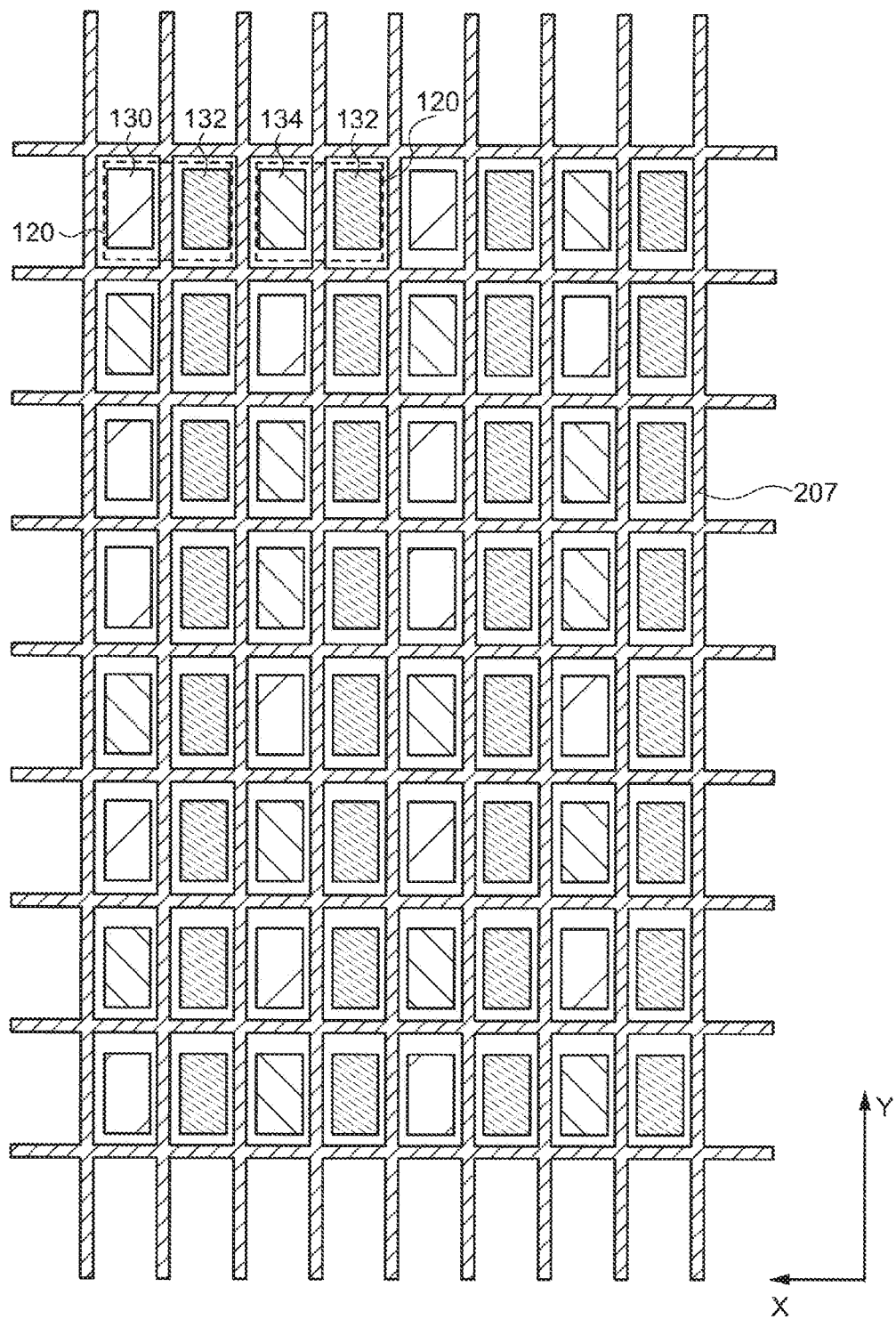
FIG. 8 is a schematic diagram showing a pixel and wiring of a display device related to one embodiment of the present invention.

FIG. 8 is a schematic diagram showing pixels and wirings of a display device according to one embodiment of the present invention. An example in which the pixel 120 has a stripe structure was shown in FIG. 1. In addition, an example in which one pixel 120 is formed by three subpixels, namely subpixel 130, subpixel 132 and subpixel 134 was shown in FIG. 1. However, the structure of the pixel is not limited to the structure shown in FIG. 1. For example, as is shown in FIG. 8, two subpixels having corresponding different colors may be included in one pixel 120. For example, one pixel 120 may include a subpixel 130 corresponding to red and a subpixel 132 corresponding to green, and a pixel 120 adjacent thereto may have a subpixel 134 corresponding to blue and a subpixel 132 corresponding to green. In this case, the reproduced color region will be different between adjacent pixels 120.

Figure 9:
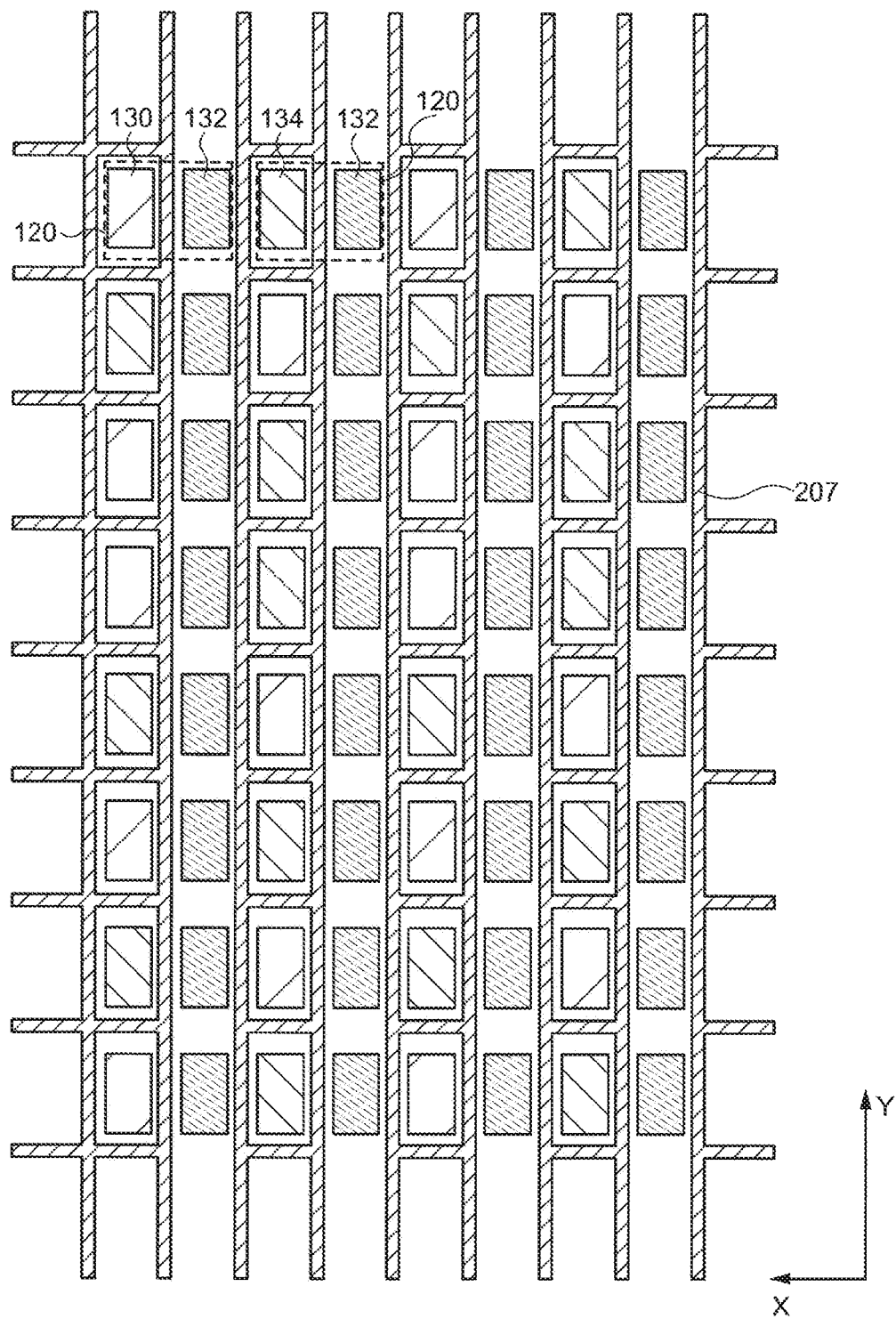
FIG. 9 is a schematic diagram showing a pixel and wiring of a display device related to one embodiment of the present invention.
Figure 10:
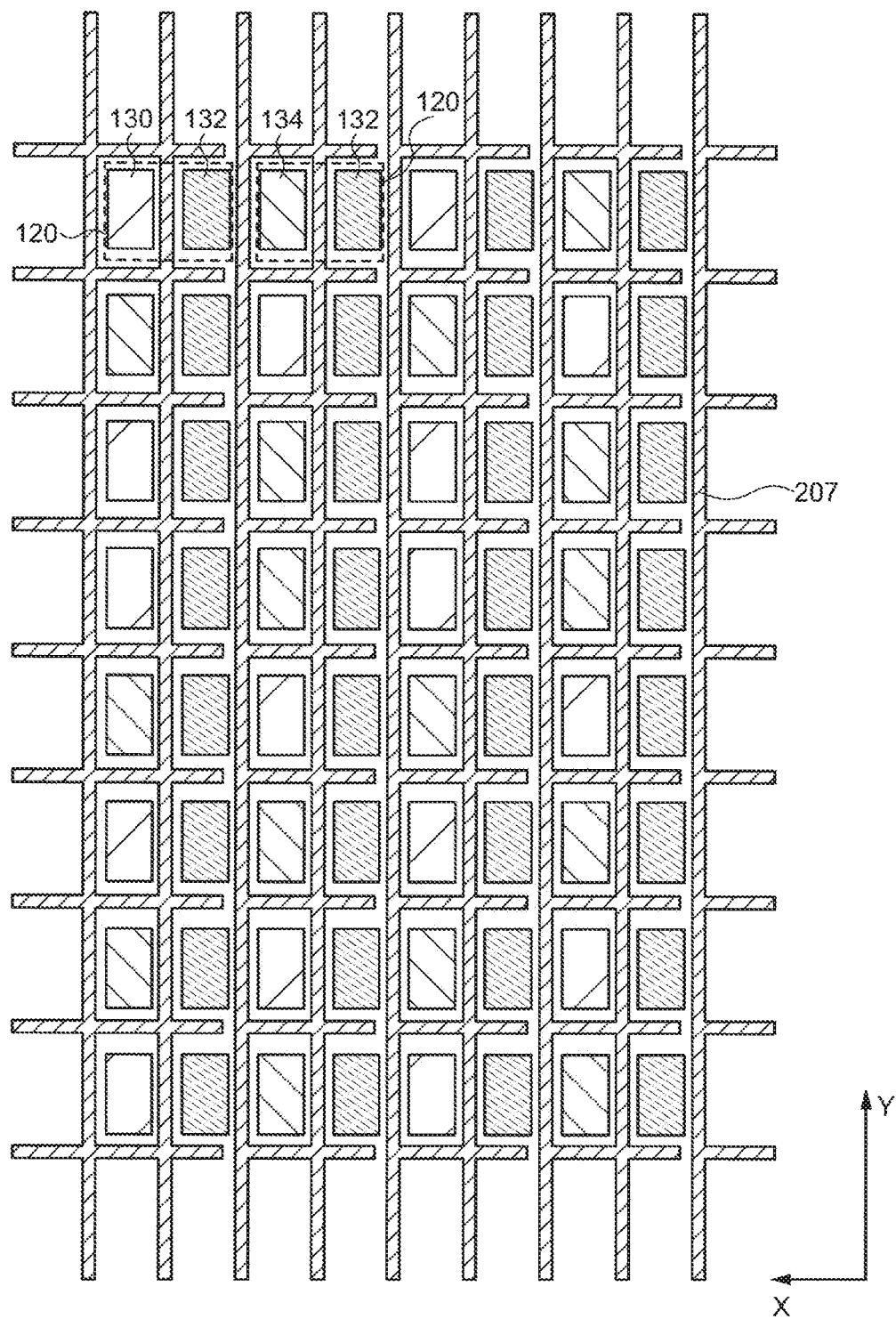
FIG. 10 is a schematic diagram showing a pixel and wiring of a display device related to one embodiment of the present invention.

In addition, as is shown in FIG. 9, the wiring 207 does not have to be arranged in the case when corresponding colors are the same in adjacent subpixels. This is because in the case where the corresponding colors are the same in adjacent subpixels, electric color mixing does not substantially become a problem. Even if a certain subpixel emits light and an adjacent subpixel of the same color slightly emits light due to electric color mixing, since the light which is emitted is the same color, the emitted light is weak and the parts which emit light are close to each other, it is difficult for a human eye to recognize. In the case where the corresponding colors are different between adjacent subpixels, since undesirable light of different colors is emitted at adjacent places. Since the undesirable light emission is recognized as a difference in chromaticity by the human eye, electric color mixing becomes a problem. Therefore, the wiring 207 according to one embodiment of the present invention is arranged. Furthermore, as is shown in FIG. 10, in the case when corresponding colors are the same in adjacent subpixels, the wiring 207 which is arranged does not have to be electrically connected. By arranging a region where the wiring 207 is not arranged or a region where the wiring 207 is not electrically connected, it is possible to reduce the sections where the resistance becomes high or deteriorates by a potential difference of voltages applied to each wiring 207 and the second electrode layer 166. That is, since it is possible to suppress heat generation at the time of high resistance or a deterioration treatment, deterioration of the light emitting element can be prevented.

Figure 11:
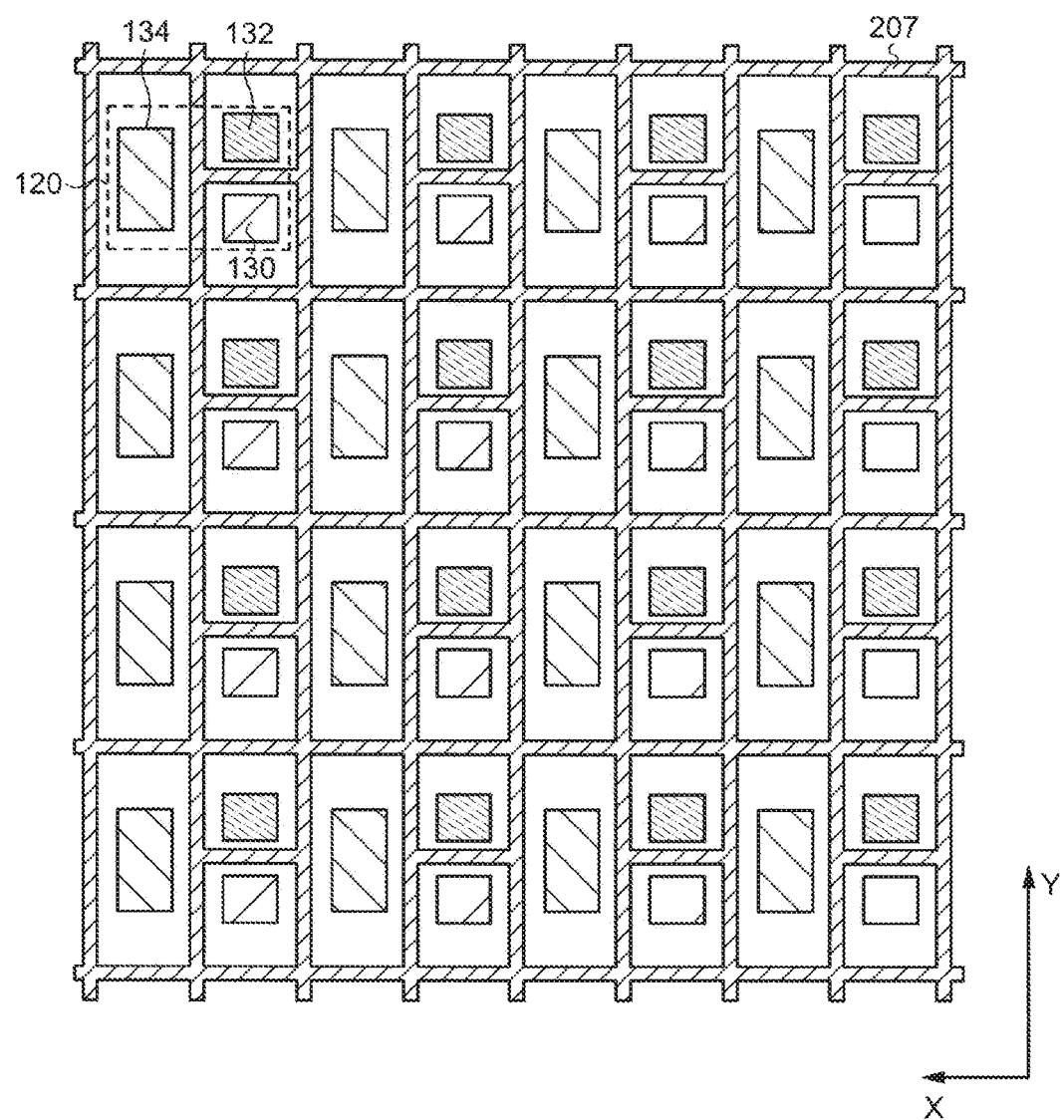
FIG. 11 is a schematic diagram showing a pixel and wiring of a display device related to one embodiment of the present invention.

In addition, the area of the subpixels within each pixel 120 may not be the same. For example, as is shown in FIG. 11, one subpixel may have an area different from the other two subpixels. In this case, for example, the area of the subpixel 132 which provides a green color is formed to be the same as the area of the subpixel 130 which provides a red color, and the area of the subpixel 134 which provides a blue color may be formed so as to be larger than the area of the subpixel 132 which provides the green color or the area of the subpixel which provides the red color 130. Furthermore, as is shown in FIG. 11, even if one subpixel has an area different from the other two subpixels, the wiring 207 can be arranged between adjacent subpixels.

Figure 12:
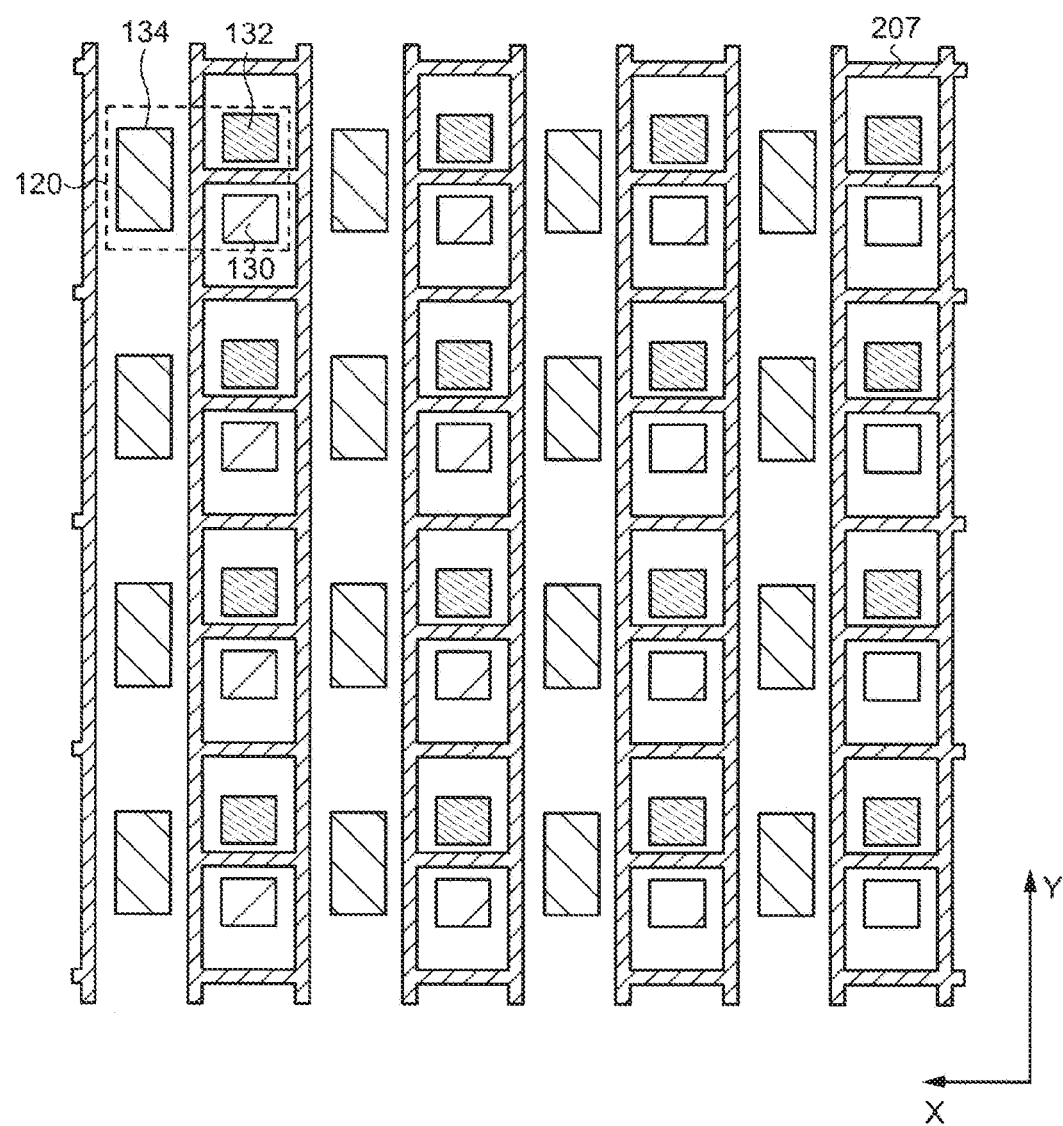
FIG. 12 is a schematic diagram showing a pixel and wiring of a display device related to one embodiment of the present invention.
Figure 13:
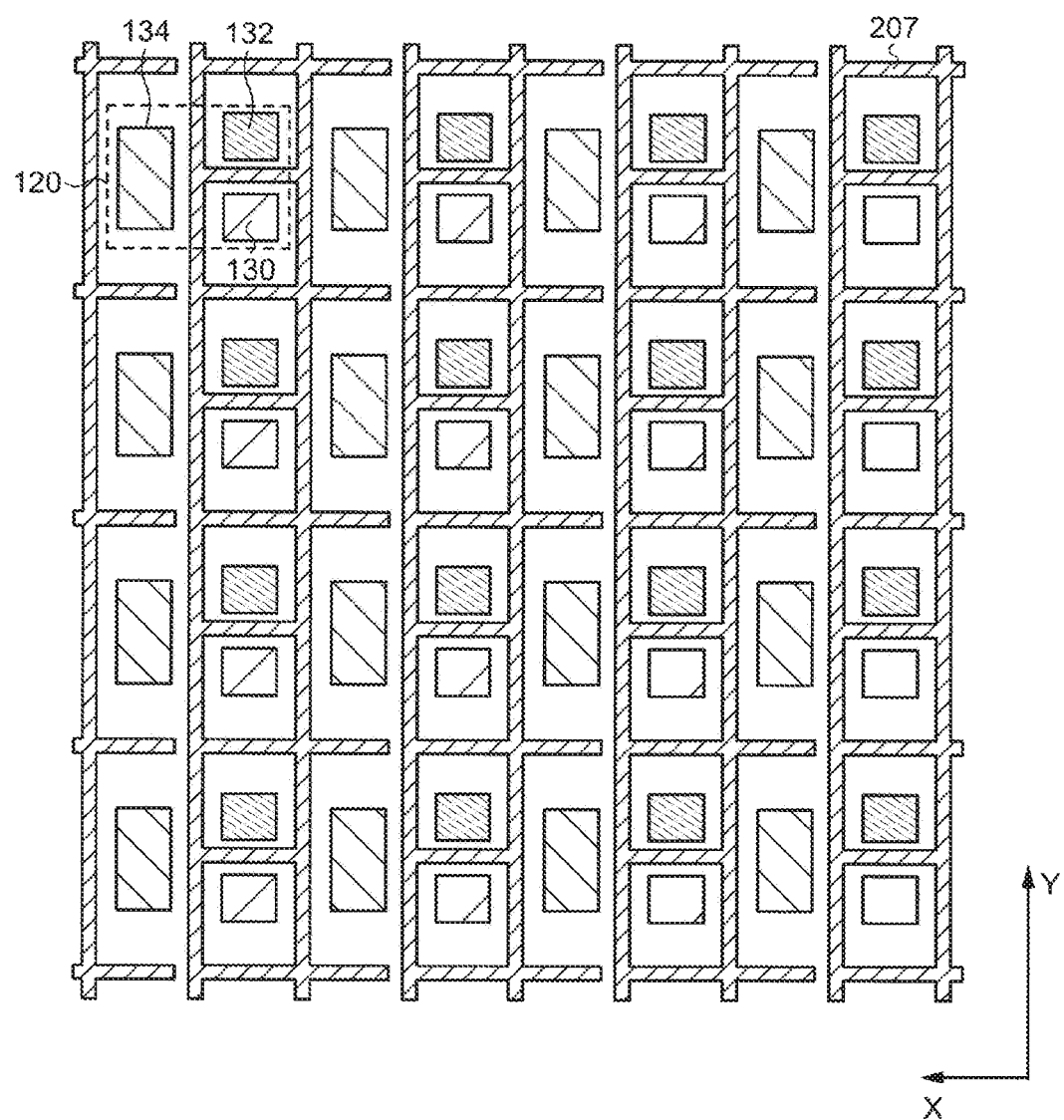
FIG. 13 is a schematic diagram showing a pixel and wiring of a display device related to one embodiment of the present invention.

In addition, as is shown in FIG. 12, even if one subpixel has an area different from the other two subpixels, in the case where corresponding colors are the same in adjacent subpixels, the wiring 207 does not have to be arranged. Furthermore, as is shown in FIG. 13, even if one subpixel has an area different from the other two subpixels, in the case where the corresponding colors are the same in adjacent subpixels, the wiring 207 which is arranged does not have to be electrically connected. By arranging a region where the wiring 207 is not arranged or a region where the wiring 207 is not electrically connected, it is possible to reduce the sections where become high resistance or deteriorated. That is, since it is possible to suppress heat generation at the time of high resistance or a deterioration treatment, deterioration of a light emitting element can be prevented.

Figure 14:
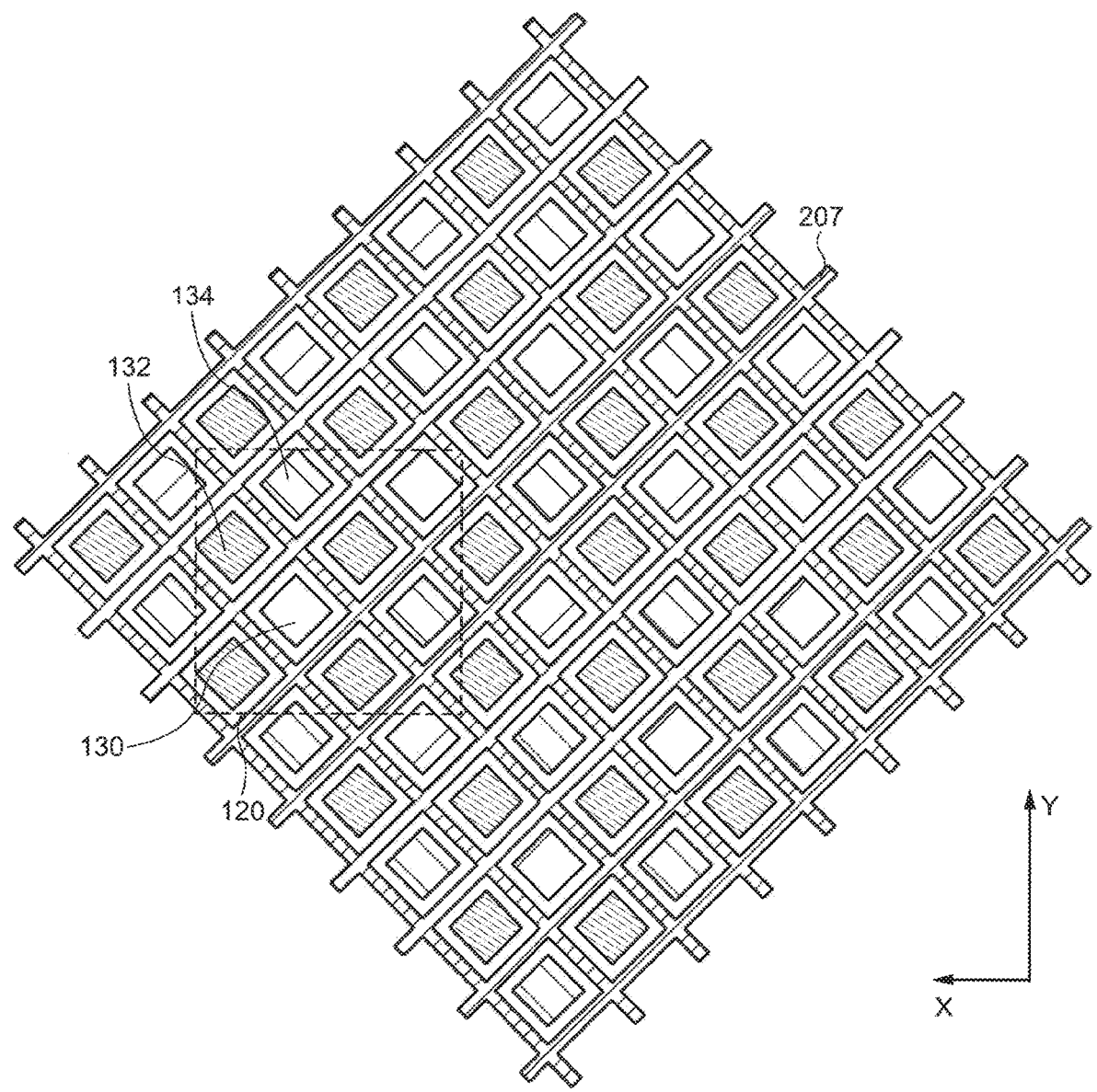
FIG. 14 is a schematic diagram showing a pixel and wiring of a display device related to one embodiment of the present invention.

Furthermore, as is shown in FIG. 14, the arrangement of the pixels 120 may be a so-called diamond pentile arrangement. In a diamond pentile arrangement, one pixel 120 includes two subpixels 130 for providing red color, two subpixels 134 for providing blue color and includes four subpixels 132 for providing green color. Also, in the diamond pentile arrangement, it is possible to arrange the wiring 207 between adjacent subpixels.

By adopting the structure described above, it is possible to eliminate a lateral leakage current in the display device. Therefore, even when the display device displays an image, it is possible to prevent adjacent pixels from emitting light. In addition, the display device can provide a clear display without reducing color purity of the image which is displayed. Furthermore, by adopting the structure described above, since it is possible to eliminate a leakage current, it is possible to provide a low power display device with reduced current consumption. In addition, by adopting the structure described above, it is possible to provide a display device that can achieve both high definition and low power consumption.

<Second Embodiment>

In the present embodiment, a structure is explained in which a region where a plurality of wirings are arranged is divided into two regions in a display region included in a display device according to one embodiment of the present invention. Furthermore, explanations with respect to the same structure as in the first embodiment may be omitted.

Figure 15:
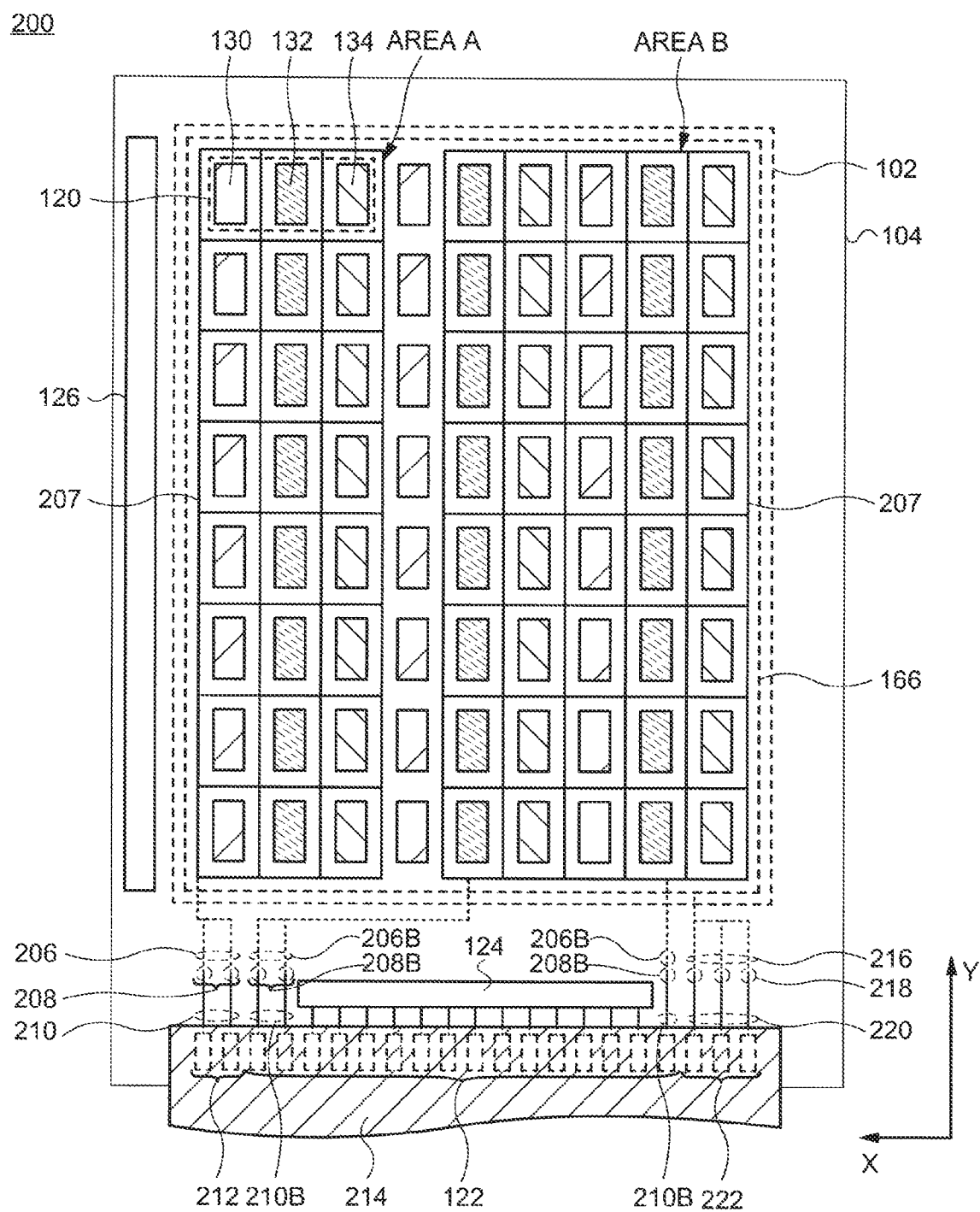
FIG. 15 is a schematic planar view diagram of a display device related to one embodiment of the present invention.

FIG. 15 is a schematic planar diagram showing a structure in which a region where the wiring 207 is arranged is divided into two regions in the display region 102 of the display device 200 according to one embodiment of the present invention.

The display device 200 has a region A electrically connected to the wiring 207 and extending in a second direction which intersects a first direction in which the wiring 207 extends, and a similar region B. The region A and the region B are independent from each other and are not electrically connected by the wiring 207. In each of the regions, the wiring 207 is formed between any one of the light emitting layer 176R, the light emitting layer 176G, or the light emitting layer 176B included in a subpixel, and any one of the light emitting layer 176R, the light emitting layer 176G, or the light emitting layer 176B included in an adjacent subpixel. In addition, the wiring 207 included in the region A is electrically connected to the first wiring 206 extending from outside of the display region 102. The first wiring 206 extends through the outside of the display region 102 and is electrically connected to the first terminal wiring 210 via the contact hole 208. The first terminal wiring 210 is exposed in the vicinity of the end part of the display device 100 and forms the first terminal 212. The first terminal 212 is connected to the connector 214. The voltage applied to the wiring 207 of the region A is provided from an external circuit (not shown in the drawing) via the first terminal 212 to the wiring 207 of the region A.

Similarly, the wiring 207 included in the region B is electrically connected to a second wiring 206B which extends from the outside of the display region 102. The second wiring 206B extends through the outside of the display region 102 and is electrically connected to the second terminal wiring 210B via a contact hole 208B. The second terminal wiring 210B is exposed in the vicinity of the end part of the display device 100 to form the second terminal 212B. The second terminal 212B is connected to the connector 214. The voltage applied to the wiring 207 included in the region B is provided to the wiring 207 included in the region B from an external circuit (not shown in the drawing) via the second terminal 212B. Furthermore, application of the voltage is performed twice in total in each of the region A and the region B.

Similarly, the second electrode layer 166 is electrically connected to the second wiring 216 which extends from outside of the display region 102. The second wiring 216 extends through the outside of the display region 102 and is electrically connected to the second terminal wiring 220 via the contact hole 218. The second terminal wiring 220 is exposed in the vicinity of the end part of the display device 100 to form the second terminal 222. The second terminal 222 is connected to the connector 214. The voltage applied to the second electrode layer 166 is provided from an external circuit to the second electrode layer 166 via the second terminal 222. The second electrode layer 166 is common to the region A and the region B. Even when there are two regions, it is possible to suppress variations in a potential difference between the wiring 207 of the region A and the wiring 207 of the region B and the second electrode layer 166 by sharing the second electrode layer 166.

Furthermore, a voltage may be supplied to the wiring 207 included in the region A and the wiring 207 included in the region B to increase the resistance value between the wiring 207 included in each region and the second electrode layer 166 and then the first terminal wiring 210 may be disconnected. In this way, even if an unexpected excess current or excess voltage is supplied to the first terminal 212 of the display device 200, it is possible to prevent breakage and display defects in the display device 200.

By adopting this this type of structure, in the display device according to one embodiment of the present invention, it is possible to divide a region and increase the resistance value between the wiring 207 of each region and the second electrode layer 166. Therefore, it is possible to reduce the possibility of breakage of the display device compared with the case where the resistance value is increased by applying a voltage to the entire region of the display device at once. More specifically, since the organic layer 300 and the light emitting layer 176 are weak with respect to heat, it is possible to reduce the risk of breakage of these layers due to heat generation which accompanies a single voltage application. In addition, by dividing the region, it is possible to reduce the power consumed by applying a single voltage.

Figure 16:
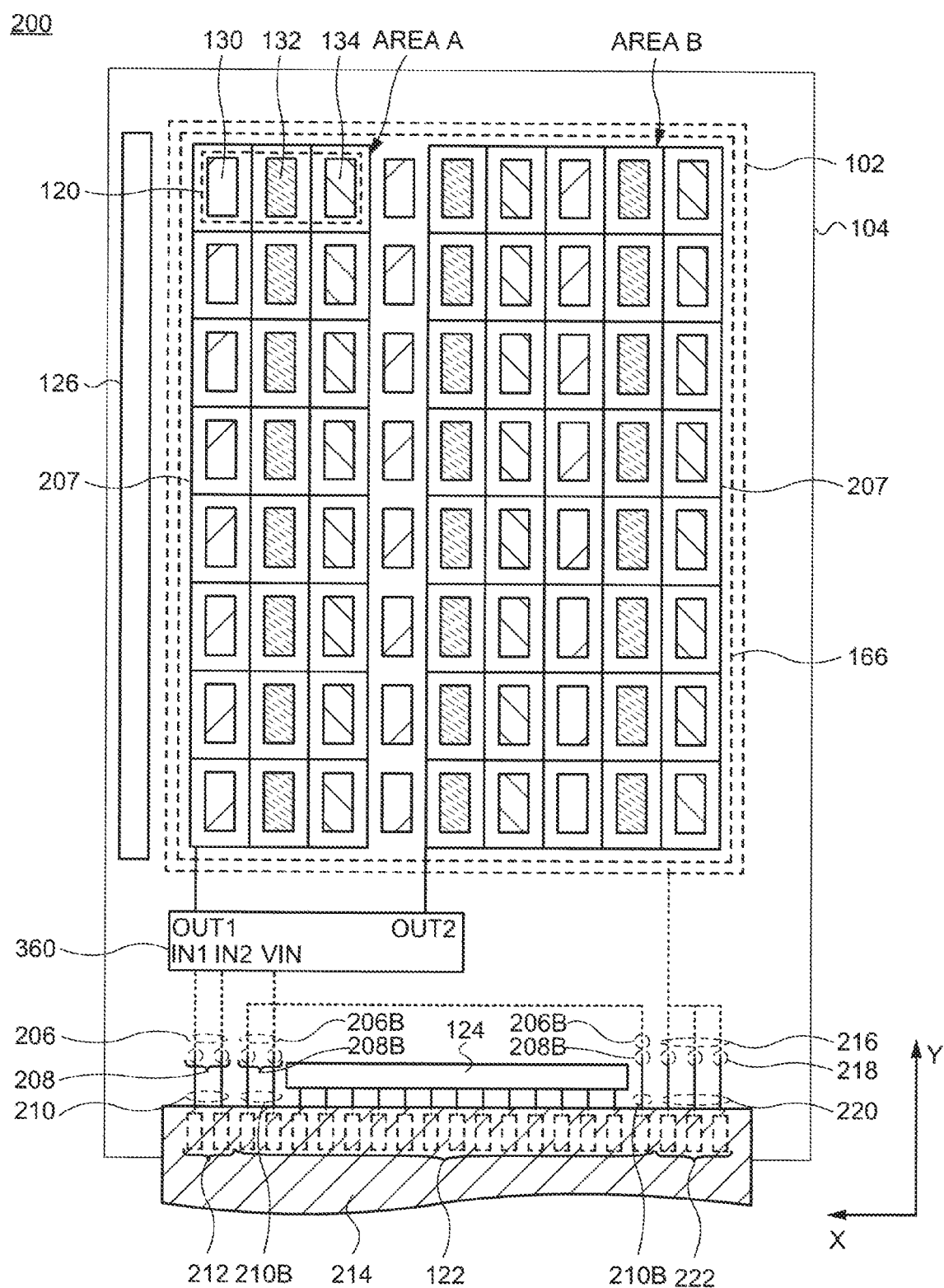
FIG. 16 is a schematic planar view diagram of a display device related to one embodiment of the present invention.

FIG. 16 shows an example in which a selection circuit 360 is added to the structure of FIG. 15.

FIG. 16 shows an example in which wiring supplies a voltage to the wiring 207 included in the region A and in the region B is set to one wiring system (VIN). The supply of voltage to the wiring 207 of the region A and the wiring 207 of the region B is distributed from a one-line system of wiring (VIN).

More specifically, one-line system of wiring (VIN), a selection signal 1 (IN1), and a selection signal 2 (IN2) are input to the selection circuit 360. In addition, OUT1 for supplying a voltage to the wiring 207 of the region A and OUT2 for supplying a voltage to the wiring 207 included in the region B are output from the selection circuit 360. The selection circuit 360 has, for example, a switch 1 electrically connected to OUT1 and a switch 2 connected to OUT2, and may be formed so that a voltage is supplied to either one of OUT1 or OUT2 by at least one of the selection signal 1 and the selection signal 2. In addition, the selection circuit 360 may be formed to supply a voltage to the wiring 207 included in the region A or the wiring 207 included in the region B by a logic circuit. The logic circuit may include, for example, a NAND or an inverter and the like. In addition, the logic circuit may include a demultiplexer or the like.

Figure 17:
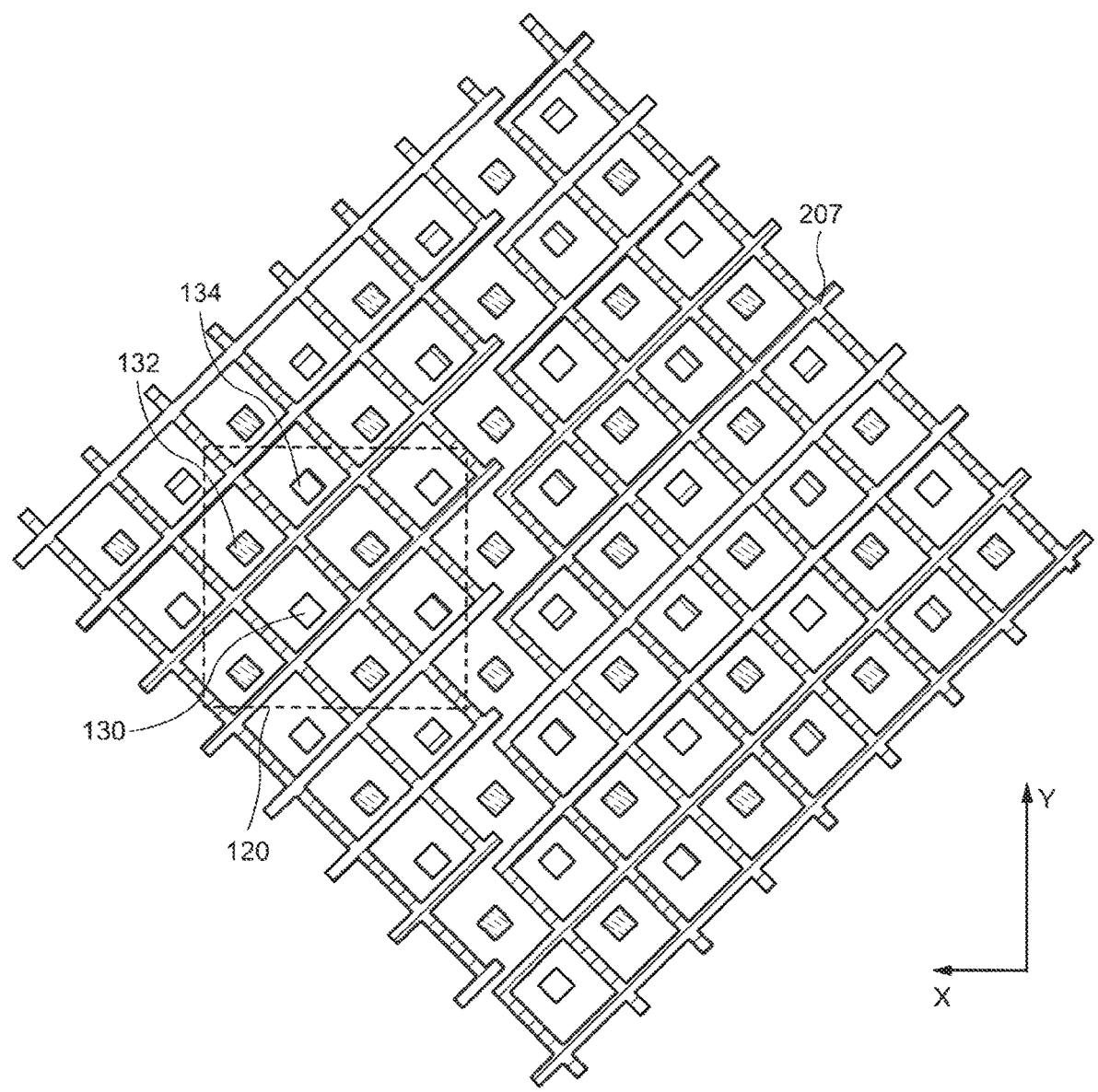
FIG. 17 is a schematic diagram showing a pixel and wiring of a display device related to one embodiment of the present invention.

Furthermore, as in the present embodiment, a case is explained in which the arrangement of the pixels 120 is a diamond pentile arrangement in the structure in which the region where the wiring 207 is arranged is divided into two sections. For example, as is shown in FIG. 17, the arranged wiring 207 can be arranged so as not to be electrically connected in a region in which subpixels having the same corresponding colors are adjacent to each other. In the upper surface view shown in FIG. 17, the left side wiring 207 corresponds to the region A shown in FIG. 15 and FIG. 16, and the right side wiring 207 corresponds to the region B shown in FIG. 15 and FIG. 16. By arranging a region where the wiring 207 is not electrically connected, it is possible to reduce the sections where the resistance becomes high or deteriorates by a potential difference of voltages applied to each wiring 207 and the second electrode layer 166. That is, since it is possible to suppress heat generation at the time of high resistance or a deterioration treatment, deterioration of a light emitting element can be prevented.

By adopting such a structure, in the display device according to one embodiment of the present invention, it is possible to divide a region and increase the resistance value between the wiring 207 of each region and the second electrode layer 166. Therefore, it is possible to reduce the possibility of breakage of the display device compared with the case where the resistance value is increased by applying a voltage to all the regions at one time. More specifically, since the organic layer 300 and the light emitting layer 176 are weak with respect to heat, it is possible to reduce the risk of breakage of these layers due to heat generation which accompanies a single voltage application. In addition, by dividing a region, it is possible to reduce the power consumed by applying a single voltage. Furthermore, since the first terminal and the display area are not directly connected by the selection circuit, even if an unexpected excess current or excess voltage is supplied, it is possible to prevent breakage of the display device and display defects.

<Third Embodiment>

In the present embodiment, a method of manufacturing the display device 100 described in the first embodiment is explained while referring to FIG. 18 and FIG. 19 to FIG. 23. FIG. 19 to FIG. 23 correspond to the cross section shown in FIG. 18. An explanation of the same contents as described in the first embodiment and the second embodiment may be omitted.

Figure 18:
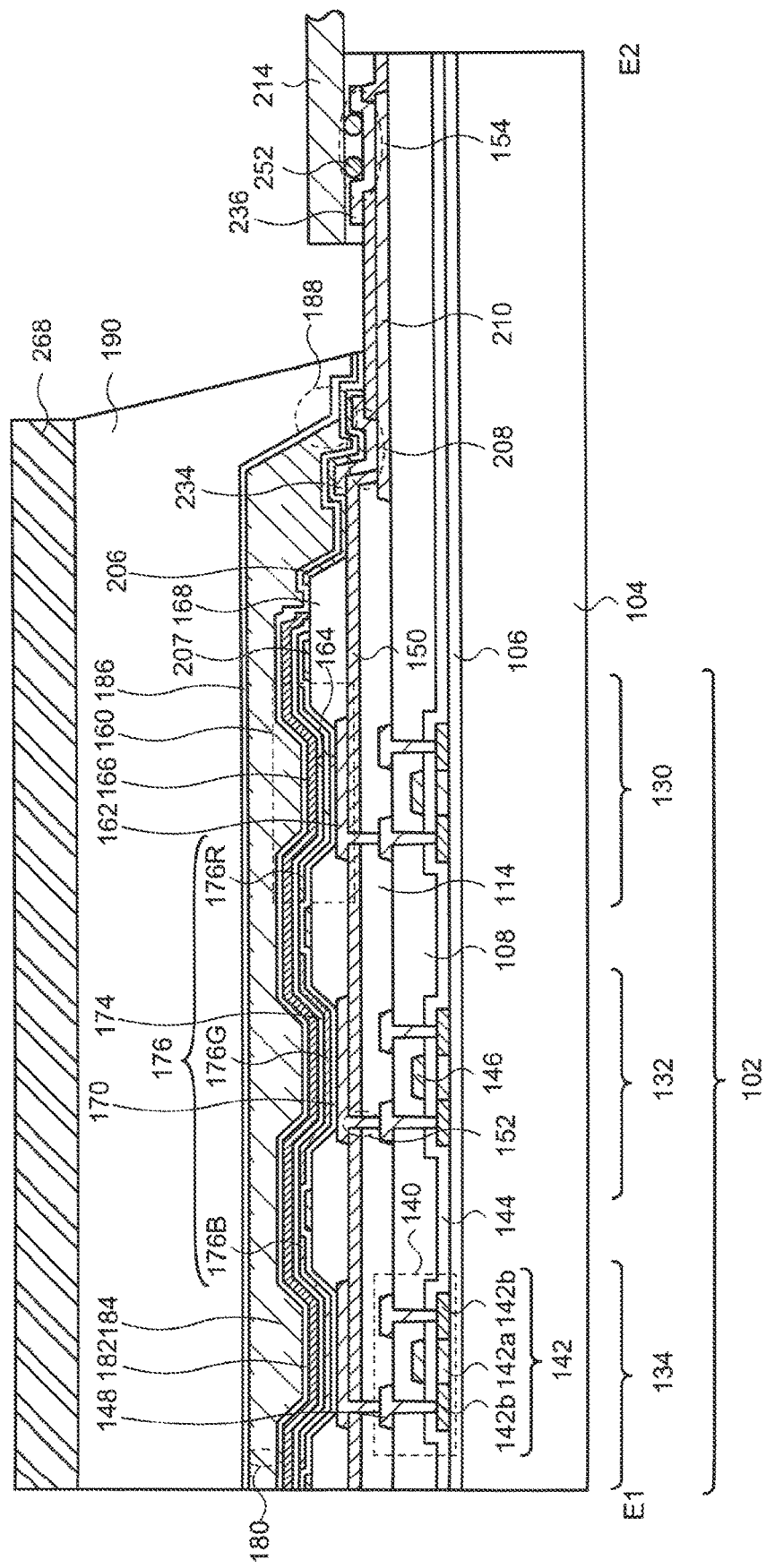
FIG. 18 is a schematic cross-sectional diagram of a display device related to one embodiment of the present invention.

First, as is shown in FIG. 18, an underlayer film 106 is formed on a substrate 104. The substrate 104 has a function for supporting a semiconductor element such as the transistor 140 included in the display region 102 and the light emitting layer 176 and the like. The material used for the substrate 104 can include, for example, glass, quartz, plastic, metal or ceramic and the like.

In the case where flexibility is provided to the display device 100, the substrate 104 may be given flexibility. Furthermore, a support substrate may be arranged under the substrate. The support substrate is formed of, for example, a hard inorganic material, glass, quartz, metal or a ceramic. In the case where the substrate 104 is flexible, the material used for the substrate 104 may include a polymer material exemplified by polyimide, polyamide, polyester, or polycarbonate. For example, the substrate 104 can be formed by applying a wet film forming method such as a printing method, an ink jet method, a spin coating method, a dip coating method or a lamination method and the like. In the case where the substrate 104 has flexibility, the display device 100 having flexibility can be obtained by peeling the substrate 104 from the support substrate after manufacturing the display device 100.

The underlayer film 106 is a film having a function of preventing impurities such as alkali metal from diffusing from the substrate 104 (and the support substrate) to the transistor 140 and the like. The material used for the underlayer film 106 may include an inorganic insulator such as silicon nitride, silicon oxide, silicon nitride oxide or silicon oxynitride. The underlayer film 106 can be formed to have a single layer or a stacked structure by applying chemical vapor deposition (CVD) or sputtering and the like.

Next, a semiconductor film 142 is formed (FIG. 19A). The semiconductor film 142 may include, for example, silicon or the like. Alternatively, the semiconductor film 142 may include an oxide semiconductor. Examples of the oxide semiconductor include a mixed oxide (IGO) of indium and gallium, or a mixed oxide (IGZO) including indium, gallium, and zinc. The matter state of the semiconductor film 142 may include any of a single crystal, polycrystalline, microcrystalline and amorphous.

The semiconductor film 142 can be formed using a CVD method or a sputtering method and the like.

Next, a gate insulating film 144 is formed to cover the semiconductor film 142 (FIG. 19A). The gate insulating film 144 may have either a single layer structure or a stacked layer structure. The gate insulating film 144 can be formed by the same method as the underlayer film 106.

Next, a gate electrode 146 is formed over the gate insulating film 144. The gate insulating film 144 is formed by a sputtering method or a CVD method and the like (FIG. 19B). The gate electrode 146 can be formed using a metal such as titanium, aluminum, copper, molybdenum, tungsten or tantalum and the like or an alloy thereof so as to have a single layer or a stacked layer structure.

Next, an interlayer film 108 is formed over the gate electrode 146 (FIG. 20A). The interlayer film 108 may have either a single layer structure or a stacked layer structure. The interlayer film 108 can be formed by the same method as the underlayer film 106. In the case where the interlayer film 108 has a stacked structure, for example, a layer containing an organic compound may be formed and then a layer containing an inorganic compound may be stacked.

Next, the interlayer film 108 and the gate insulating film 144 are etched to form an opening which reaches the semiconductor film 142. The opening can be formed by performing plasma etching in a gas containing a fluorine-containing hydrocarbon, for example.

Next, a metal film is formed to cover the opening, and etching is performed to form source or drain electrodes 148. In the present embodiment, the first terminal wiring 210 is formed at the same time as the formation of the source or drain electrodes 148 (FIG. 20B). Therefore, it is possible for the source or drain electrodes 148 and the first terminal wiring 210 to exist in the same layer. Here, the metal film can have a structure similar to the gate electrode 146. In addition, the metal film can be formed using the same method as the formation of the gate electrode 146.

Next, a planarization film 114 is formed to cover the source or drain electrodes 148 and the first terminal wiring 210 (FIG. 21A). The planarization film 114 has a function for absorbing unevenness and inclinations caused by the transistor 140 and the first terminal wiring 210 and the like, and to provide a flat surface. The planarization film 114 can be formed using an organic insulator. Examples of the organic insulator include polymer materials such as epoxy resin, acrylic resin, polyimide, polyamide, polyester, polycarbonate or polysiloxane. The planarization film 114 can be formed by the wet film formation method described above.

Next, an inorganic insulating film 150 is formed on the planarization film 114 (FIG. 21A). As described above, the inorganic insulating film 150 functions as a protective film for the transistor 140. In addition, the inorganic insulating film 150 may form a capacitor (not shown in the drawing) together with the first electrode 162 of the light emitting element 160 formed later. Therefore, it is preferred to use a material having a relatively high dielectric constant as a material for forming the inorganic insulating film 150. For example, silicon nitride, silicon nitride oxide and silicon oxynitride or the like can be used for the inorganic insulating film 150. In addition, the inorganic insulating film 150 can be formed by applying a CVD method or a sputtering method.

Next, as is shown in FIG. 21B, an opening 154, a contact hole 152 and a contact hole 208 are formed. Following this, a first electrode 162, a connection electrode 234 and a connection electrode 236 are formed to cover the opening 154, the contact hole 152 and the contact hole 208 (FIG. 22A).

Here, a region where the connection electrode 236 is formed becomes a region to which the connector 214 such as an FPC or the like is connected later via an anisotropic conductive film or the like. The region where the connection electrode 236 is formed is larger in area than the region where the connection electrode 234 is formed.

Furthermore, the region where the connection electrode 236 is formed includes the opening 154. In addition, the region where the connection electrode 234 is formed includes the contact hole 208. For example, the region where the connection electrode 236 is formed has a width of 10 μm or more and 50 μm or less and a length of 1 mm or more and 2 mm or less. The region where the connection electrode 234 is formed has, for example, a width of several μm or more and several tens of μm or less and a length of several μm or more and several tens of μm or less. The opening 154 may be a minimum size as long as it is a size which allows the first terminal wiring 210, the connection electrode 234 and the first wiring 206 to be connected with a sufficiently low contact resistance.

For example, the first electrode 162 is formed using a metal having a high reflectance such as silver or aluminum or an alloy thereof. In the first electrode 162, a light transmitting conductive oxide film may be formed over a film including these metals or alloys. Examples of the conductive oxide include ITO and IZO and the like. In addition, the first electrode 162 may be formed using ITO or IZO.

In the present embodiment, the first electrode 162, the connection electrode 234 and the connection electrode 236 are formed on the inorganic insulating film 150. The connection electrode 234 and the connection electrode 236 may exist in the same layer as the first electrode 162. Therefore, for example, the metal film described above is formed to cover the opening 154, the contact hole 152 and the contact hole 208, and then it is possible to form a film containing a conductive oxide, and form the first electrode 162, the connection electrode 234 and the connection electrode 236. In addition, the conductive oxide film, the metal film described above, and the conductive oxide film are sequentially stacked to cover the opening 154, the contact hole 152 and the contact hole 208, and the first electrode 162, the connection electrode 234 and the connection electrode 236 may be formed. In addition, a conductive oxide is formed to cover the opening 154, the contact hole 152 and the contact hole 208 and following this, a stacked film of a conductive oxide film, the metal film described above, and a conductive film may be formed to selectively cover the contact hole 152. When the first electrode 162 covers the contact hole 152 and is electrically connected to the source or drain electrodes 148, a current is supplied to the light emitting element 160 via the transistor 140.

Next, a partition wall 168 is formed to cover an end part of the first electrode 162 (FIG. 22B). The partition wall 168 can absorb steps caused by the first electrode 162 and the like and electrically insulates the first electrodes 162 of adjacent subpixels from each other. The partition wall 168 can be formed by a wet film formation method using, for example, an epoxy resin or an acrylic resin and the like.

Next, wiring 207 is formed. In the present embodiment, the first wiring 206 is formed at the same time with the formation of the wiring 207 (FIG. 22B). Therefore, the wiring 207 and the first wiring 206 can exist in the same layer. It is preferred that the wiring 207 and the first wiring 206 are metal films. The wiring 207 and the first wiring 206 can have a similar structure to that of the gate electrode 146. In addition, the wiring 207 and the first wiring 206 can be formed using the same method as the formation of the gate electrode 146.

Next, the light emitting element 160 is formed over the planarization film 114 and the inorganic insulating film 150. The light emitting element 160 is formed by a first electrode (pixel electrode) 162, a functional layer 164 and a second electrode (opposing electrode) layer 166. The second electrode layer 166 may extend continuously over the entire display area. The functional layer 164 is formed to cover the first electrode 162, the partition wall 168 and the wiring 207. In addition, the second electrode layer 166 is formed above the functional layer 164 (FIG. 22B). Carriers are injected into the functional layer 164 from the first electrode 162 and the second electrode layer 166, and carrier recombination occurs in the functional layer 164. In this way, the light emitting molecules in the functional layer 164 are brought to an excited state, and light emission is obtained through a process of relaxation to a ground state. Therefore, a region where the first electrode 162 and the functional layer 164 are in contact is a light emitting region in the subpixel 130, the subpixel 132 and the subpixel 134. Furthermore, the functional layer 164 includes the organic layer 300.

It is possible to appropriately select the structure of the functional layer 164. For example, the functional layer 164 can be formed by combining a carrier injection layer, a carrier transport layer, a light emitting layer, a carrier blocking layer and an exciton blocking layer and the like. In FIG. 18, an example is shown in which the functional layer 164 has a layer 170, a layer 176 and a layer 174. In this case, for example, the layer 170 may be a carrier (hole) injection and/or transport layer, the layer 176 may be a light emitting layer and the layer 174 may be a carrier (electron) injection and/or transport layer. The carrier (hole) injection and/or transport layer and the carrier (electron) injection and/or transport layer may spread continuously throughout the entire display region. Furthermore, the functional layer 164 can be formed by applying a wet film formation method such as an inkjet method or a spin coating method, or a dry film formation method such as a vapor deposition method.

In addition, the functional layer 164 may include a first unit including a first carrier (hole) injection and/or transport layer, a light emitting layer 176B which emits blue light, a first carrier (electron) injection and/or transport layer, and a second unit including a second carrier (hole) injection and/or transport layer, a light emitting layer which emits red and green light and a second carrier (electron) injection and/or transport layer and the like. In addition, the functional layer 164 may have a so-called tandem structure in which the first unit, an intermediate layer, and the second unit are stacked. When the functional layer 164 has a tandem structure, it is possible to obtain light emission of each color from each unit regardless of one display element, and therefore it is possible to provide a display element with high efficiency.

In addition, as is shown in FIG. 18, the layer 176 which is a light emitting layer can be formed to include different materials in the subpixel 130, the subpixel 132 and the subpixel 134. Specifically, the subpixel 130 may include a light emitting layer 176R corresponding to red, the subpixel 132 may include a light emitting layer 176G corresponding to green and the subpixel 134 may include a light emitting layer 176B corresponding to blue. In this case, it is preferred that the layer 170 and the layer 174 are formed so as to be shared by the subpixel 130, the subpixel 132 and the subpixel 134. That is, the layer 170 and the layer 174 may be formed over the subpixel 130, the subpixel 132, the subpixel 134 and the partition wall 168. By appropriately selecting the material used for the layer 176, it is possible to obtain light emission of different colors in the subpixel 130, the subpixel 132 and the subpixel 134. In addition, the structure of the layer 174 may be the same between the subpixel 130, the subpixel 132 and the subpixel 134.

In this case, the layer 174 may also be formed over the subpixel 130, the subpixel 132, the subpixel 134 and the partition wall 168 so as to be shared by the subpixel 130, the subpixel 132 and the subpixel 134. In such a structure, it is possible to obtain light emission of the same color from the subpixel 130, the subpixel 132, and the layer 176 of the subpixel 134. Therefore, for example, the layer 176 may be formed to emit white light, and various colors (for example, red, green, and blue) may be extracted from the subpixel 130, the subpixel 132 and the subpixel 134 by using color filters.

In the case when the light emitted from the light emitting element 160 is extracted from the first electrode 162, a metal such as aluminum, magnesium, silver or an alloy thereof may be used for the second electrode layer 166. In the case when the light emitted from the light emitting element 160 is extracted from the second electrode layer 166, a light transmitting conductive oxide such as ITO may be used for the second electrode layer 166. The metals described above can be formed to a thickness that allows visible light to pass through. A thickness which allows visible light to pass through is, for example, 5 nm or more and 20 nm or less. In this case, a light transmitting conductive oxide may be further stacked.

Figure 23:
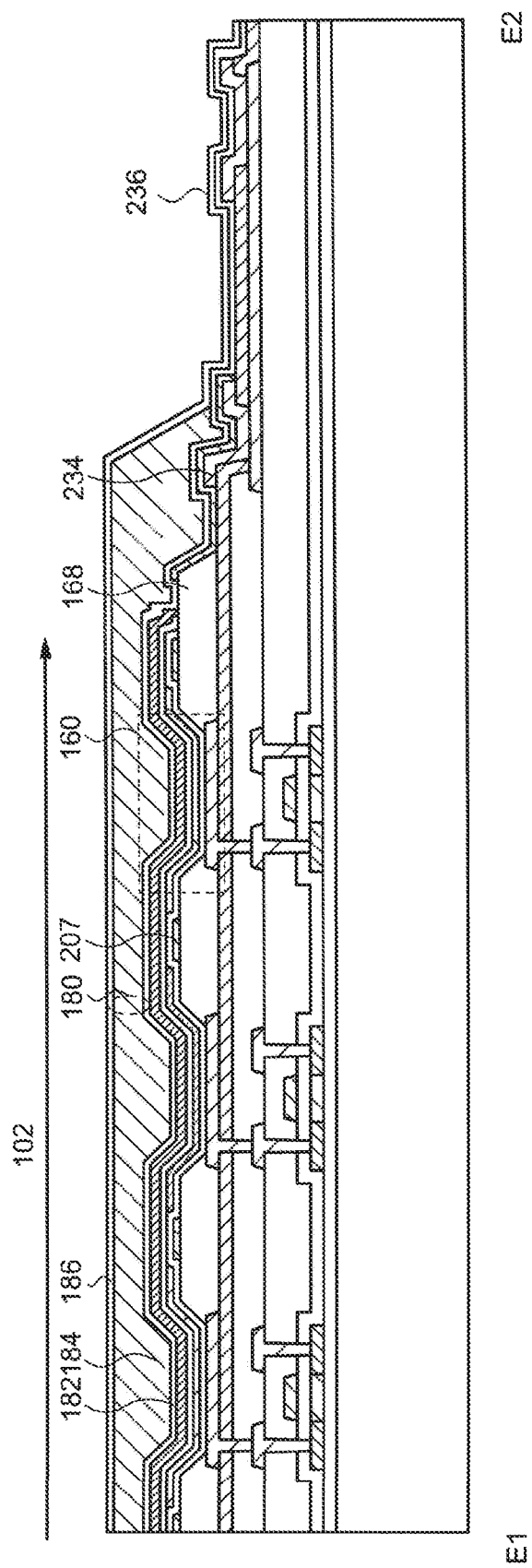
FIG. 23 is a schematic cross-sectional diagram for explaining a manufacturing method of a display device related to one embodiment of the present invention.

Next, a sealing film 180 is formed. First, as is shown in FIG. 23, a first inorganic film 182 is formed to cover the light emitting element 160, the connection electrode 234 and the connection electrode 236. The first inorganic film 182 can include an inorganic material such as, for example, silicon nitride, silicon oxide, silicon nitride oxide or silicon oxynitride. In addition, the first inorganic film 182 can be formed using the same method as the underlayer film 106.

Next, an organic film 184 is formed (FIG. 23). The organic film 184 may contain an organic resin including acrylic resin, polysiloxane, polyimide or polyester and the like. In addition, as is shown in FIG. 23, the organic film 184 may be formed to absorb irregularities caused by the partition wall 168 and the organic film 184 may be formed to a thickness so that a flat surface is provided. The organic film 184 is preferred to be formed selectively within the display region 102. That is, it is preferred that the organic film 184 be formed so as not to overlap with the connection electrode 234 and the connection electrode 236. The organic film 184 can be formed by a wet film formation method such as an inkjet method. Alternatively, the organic film 184 may be formed by forming an oligomer which is a raw material of the polymer material, in a mist state or a gaseous state under reduced pressure, blowing it onto the first inorganic film 182 and then polymerizing the oligomer.

Following this, a second inorganic film 186 is formed (FIG. 23). The second inorganic film 186 has a similar structure similar to the first inorganic film 182. In addition, the second inorganic film 186 can be formed by the same method as the first inorganic film 182. The second inorganic film 186 can also be formed so as to cover not only the organic film 184 but also the connection electrode 234 and the connection electrode 236. As a result, the organic film 184 can be sealed by the first inorganic film 182 and the second inorganic film 186.

Next, an organic insulating film 190 is formed (FIG. 18). The organic insulating film 190 may include the same material as the organic film 184. In addition, the organic insulating film 190 can be formed by the same method as the organic film 184. As is shown in FIG. 23, it is preferred that the organic insulating film 190 selectively covers a region where the first inorganic film 182 and the second inorganic film 186 are in contact with each other in the display region 102. Furthermore, as is shown in FIG. 23, the organic insulating film 190 is preferred to be formed so as not to overlap with the connection electrode 234 and the connection electrode 236. Next, using the organic insulating film 190 as a mask, the first inorganic film 182 and the second inorganic film 186 exposed from the organic insulating film 190 are removed by etching.

In this way, the connection electrode 234 is exposed in the contact hole 208 arranged outside the display region 102. In addition, the connection electrode 236 is exposed in the opening 154 arranged outside the display region 102. At this time, a part of the inorganic insulating film 150 is also etched, and the thickness of the inorganic insulating film 150 sometimes becomes thin. Furthermore, the organic insulating film 190 may be a substance with adhesive properties formed from an organic material.

Following this, a cover film 268 is formed. Next, the display device 100 shown in FIG. 18 can be formed by electrically connecting the connector 214 and the opening 154 using the anisotropic conductive film 252 and the like. The organic insulating film 190 may include a polymer material such as polyester, epoxy resin or acrylic resin. In addition, the organic insulating film 190 can be formed by applying a printing method or a lamination method and the like. The cover film 268 can be formed from a polymer material similar to the organic insulating film 190 or a polymer material such as polyolefin or polyimide.

Although not shown in the drawing, in the case when the display device 100 is provided with flexibility, for example, after arranging the connector 214, light such as a laser may be irradiated from the side of the substrate 104. By irradiating light such as laser from the side of the substrate 104, it is possible to reduce the adhesive force between the substrate 104 and the support substrate. Following this, by peeling the substrate 104 from the support substrate using physical force, it is possible to provide the display device 100 with flexibility. In addition, in the case where flexibility is provided to the display device 100, after forming the organic insulating film 190, light such as a laser may be irradiated from the substrate 104 side.

Furthermore, the present embodiment may be freely combined with other embodiments described in the present invention.

As is described in the present embodiment, the wiring is arranged above the partition wall and the second electrode layer is further formed above the wiring. Since the display device manufactured as described above can eliminate a lateral leakage current, it is possible to provide a clear display without reducing the color purity of the image to be displayed. Furthermore, by adopting the structure described above, it is possible to provide a low power display device. In addition, by adopting the structure described above, it is possible to provide a display device which can achieve both high definition and low power consumption.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Although an EL display device is exemplified in the present specification, other self-light emitting type display devices can be given as another application example. In addition, the size of the display device exemplified in the present specification can be applied from a medium to small size to a large size without any particular limitation.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:
   a first electrode layer including a plurality of first electrodes arranged in a first direction and a second direction intersecting the first direction;
   a second electrode layer;
   an organic layer including a plurality of light emitting layers;
   a wiring layer including a plurality of wirings extending in the first direction and the second direction; and
   a barrier wall covering edges of the plurality of first electrodes;
   wherein
   the plurality of wirings is in contact with a top of the barrier wall,
   each of the plurality of light emitting layers is between one of the plurality of first electrodes and the second electrode layer,
   the organic layer is between each of the plurality of wirings and the second electrode layer,
   one of the plurality of wirings is between two adjacent first electrodes of the plurality of first electrodes in a planar view,
   another one of the plurality of wirings is between another two adjacent first electrodes of the plurality of first electrodes in the planar view,
   the one of the plurality of wirings, the another one of the plurality of wirings, the one of the plurality of first electrodes, and the second electrode layer are configured so that a first voltage to be applied between the one of the plurality of wirings and the second electrode layer and a second voltage to be applied between the another one of the plurality of wirings and the second electrode layer are both higher than a third voltage to be applied between the one of the plurality of first electrodes and the second electrode layer,
   the one of the plurality of wirings and the another one of the plurality of wirings are separated from each other, and
   the one of the plurality of wirings and the another one of the plurality of wirings are connected to a selection circuit configured to apply the first voltage and the second voltage at different periods from each other.

2. The display device according to claim 1, wherein the organic layer and the second electrode are continuously spread respectively.

3. The display device according to claim 1, wherein the organic layer includes an electron transport layer and a hole transport layer.

4. The display device according to claim 1, wherein
   the organic layer between the one of the plurality of wirings and the second electrode is deteriorated.

5. The display device according to claim 1, wherein
   a resistance value between the one of the plurality of wirings and the second electrode is higher than a resistance value between the one of the plurality of first electrodes and the second electrode.

* * * * *